(12) United States Patent
Kobayashi et al.

(10) Patent No.: US 11,387,251 B2
(45) Date of Patent: Jul. 12, 2022

(54) MEMORY DEVICE

(71) Applicant: Kioxia Corporation, Tokyo (JP)

(72) Inventors: Shigeki Kobayashi, Kuwana Mie (JP);
Toru Matsuda, Yokkaichi Mie (JP);
Hanae Ishihara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 108 days.

(21) Appl. No.: 16/800,214

(22) Filed: Feb. 25, 2020

(65) Prior Publication Data

US 2021/0082947 A1 Mar. 18, 2021

(30) Foreign Application Priority Data

Sep. 18, 2019 (JP) .............................. JP2019-169365

(51) Int. Cl.
*H01L 27/11556* (2017.01)
*H01L 27/11582* (2017.01)
*H01L 29/26* (2006.01)

(52) U.S. Cl.
CPC .. *H01L 27/11582* (2013.01); *H01L 27/11556* (2013.01); *H01L 29/26* (2013.01)

(58) Field of Classification Search
CPC .......................... H01L 27/11551–11556; H01L 27/11578–1158
See application file for complete search history.

(56) References Cited

U.S. PATENT DOCUMENTS

| | | | |
|---|---|---|---|
| 9,431,419 B2 | 8/2016 | Fukuzumi et al. | |
| 9,455,263 B2 | 9/2016 | Zhang et al. | |
| 9,929,177 B2 | 3/2018 | Nagumo | |
| 2017/0243883 A1 | 8/2017 | Kobayashi et al. | |
| 2019/0189629 A1* | 6/2019 | Parekh | G11C 16/08 |
| 2019/0326310 A1* | 10/2019 | Fukuzumi | H01L 27/11565 |
| 2019/0393238 A1* | 12/2019 | Lim | H01L 27/1157 |

* cited by examiner

*Primary Examiner* — Eric A. Ward
(74) *Attorney, Agent, or Firm* — Kim & Stewart LLP

(57) ABSTRACT

A memory device includes a substrate, first, second, and third conductive layers, a stack of fourth conductive layers, a memory pillar, and an insulator. The first, second, and third conductive layer are provided above the substrate. The stack of fourth conductive layers is provided above the third conductive layer. The memory pillar extends in the thickness direction through the stack and the third conductive layer and into the second conductive layer in a first region of the memory device. The insulator extends in a thickness direction through the stack, the third conductive layer, and the second conductive layer in a second region of the memory device. The insulator also extends in a second surface direction of the substrate. A thickness of the third conductive layer in a region through which the insulator extends is greater than a thickness of the third conductive layer in the first region.

17 Claims, 17 Drawing Sheets

MEMORY DEVICE

CROSS-REFERENCE TO RELATED APPLICATION

This application is based upon and claims the benefit of priority from Japanese Patent Application No. 2019-0169365, filed on Sep. 18, 2019, the entire contents of which are incorporated herein by reference.

FIELD

Embodiment described herein relates generally to a memory device.

BACKGROUND

A NAND flash memory having a three-dimensional structure is known.

DETAILED DESCRIPTION

Embodiments provide a memory device with better characteristics.

In general, according to an embodiment, a memory device includes a substrate, first, second, and third conductive layers, a stack of fourth conductive layers, a memory pillar, and an insulator. The first conductive layer is provided above the substrate in a thickness direction of the substrate. The second conductive layer is directly provided on the first conductive layer. The third conductive layer is directly provided on the second conductive layer. The stack of fourth conductive layers is provided above the third conductive layer in the thickness direction. The memory pillar extends in the thickness direction through the stack of fourth conductive layers and the third conductive layer and into the second conductive layer in a first region of the memory device. The memory pillar includes a semiconductor layer having a side surface in contact with the second conductive layer. A plurality of memory cells is provided at intersections of the memory pillar and the fourth conductive layers, respectively. The insulator extends in the thickness direction through the stack of fourth conductive layers, the third conductive layer, and the second conductive layer in a second region of the memory device that is adjacent to the first region in a first surface direction of the substrate. The insulator also extends in a second surface direction of the substrate different from the first surface direction. A thickness of the third conductive layer in a region through which the insulator extends is greater than a thickness of the third conductive layer in the first region.

Hereinafter, embodiments will be described with reference to drawings. Each embodiment shows a device and a method for embodying the technical idea of the present disclosure. The drawings are schematic or conceptual, and the dimensions and ratios of the drawings are not necessarily the same as the actual ones. The technical idea of the present disclosure is not specified by the shape, structure, arrangement, and the like of the components.

[1] Embodiment

A memory device and a manufacturing method thereof according to an embodiment will be described below with reference to FIGS. 1 to 19.

(A) CONFIGURATION EXAMPLE

A configuration example of the memory device according to the present embodiment will be described with reference to FIGS. 1 to 5.

Figure 1:
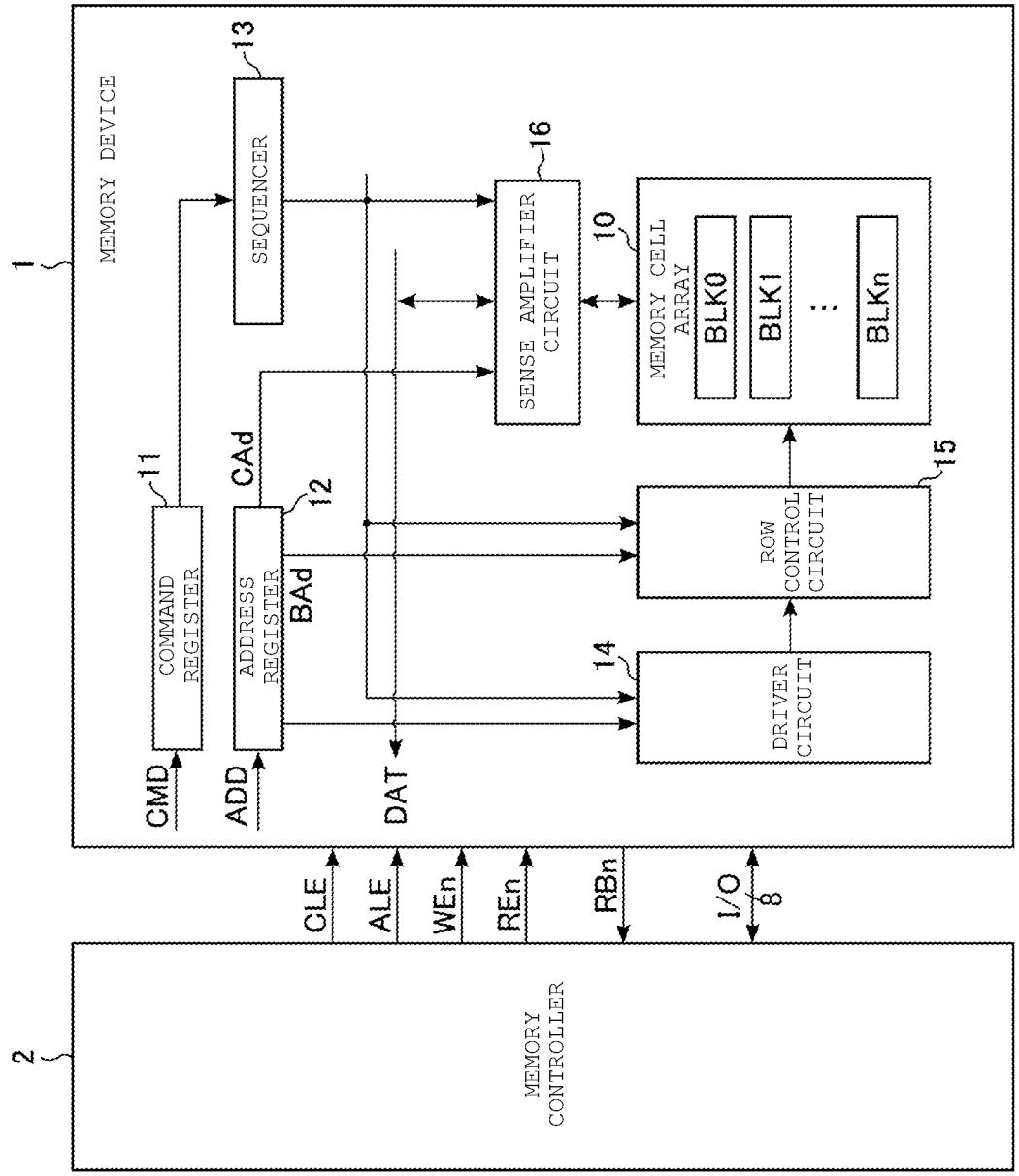
FIG. 1 is a block diagram of a memory device according to an embodiment.

FIG. 1 is a block diagram showing a configuration example of the memory device according to the present embodiment.

As shown in FIG. 1, a memory device 1 of the present embodiment is electrically coupled to a memory controller 2.

The memory controller 2 sends a command CMD, address information ADD, and various control signals CNT to the memory device 1 of the present embodiment.

The memory device 1 receives a command CMD, address information ADD, and various control signals CNT. Data DAT is transferred between the memory device 1 and the memory controller 2. Hereinafter, the data DAT transferred from the memory controller 2 to the memory device 1 during a write operation is referred to as write data. The write data DAT is written in the memory device 1. Data DAT transferred from the memory device 1 to the memory controller 2 during a read operation is referred to as read data. Read data DAT is read from the memory device 1.

The memory device 1 of the present embodiment includes, for example, a memory cell array 10, a command register 11, an address register 12, a sequencer 13, a driver circuit 14, a row control circuit 15, and a sense amplifier circuit 16.

The memory cell array 10 stores data. A plurality of bit lines and a plurality of word lines are provided in the memory cell array 10. The memory cell array 10 includes a plurality of blocks BLK0 to BLKn (n is an integer of 1 or more). The block BLK is a set of a plurality of memory cells and is used as a data erasing unit, for example. Each memory cell is associated with one bit line and one word line. The configuration of the memory cell array 10 will be described below.

The command register 11 stores a command CMD from the memory controller 2. The command CMD includes, for example, instructions that cause the sequencer 13 to execute a read operation, a write operation, an erasing operation, and the like.

The address register 12 stores address information ADD from the memory controller 2. The address information ADD includes, for example, a block address, a page address, and a column address. For example, the block address, page address, and column address are used to select a block BLK, a word line, and a bit line, respectively. In the following, a block selected based on a block address is referred to as a selected block. A word line selected based on a page address is referred to as a selected word line.

The sequencer 13 controls the operation of the entire memory device 1. For example, the sequencer 13 controls the driver circuit 14 based on the command CMD in the command register 11.

The driver circuit 14 outputs a voltage used in a read operation, a write operation, an erasing operation, and the like to the memory cell array 10. Based on the page address in the address register 12, the driver circuit 14 applies a predetermined voltage to, for example, a wiring corresponding to the selected word line.

The row control circuit 15 controls operations related to the rows of the memory cell array 10. The row control circuit 15 selects one block BLK in the memory cell array 10 based on the block address in the address register 12. For example, the row control circuit 15 transfers the voltage applied to the wiring corresponding to the selected word line to the selected word line in the selected block BLK.

The sense amplifier circuit 16 controls operations related to the columns of the memory cell array 10. In a write operation, the sense amplifier circuit 16 applies a voltage to each of the bit lines provided in the memory cell array 10 in accordance with the write data DAT from the memory controller 2. In a read operation, the sense amplifier circuit 16 determines the data stored in the memory cell based on the potential of the bit line (or the presence or absence of current generation). The sense amplifier circuit 16 transfers data based on the determination result to the memory controller 2 as read data DAT.

For example, the memory device 1 is a NAND flash memory.

In this case, communication between the memory device 1 and the memory controller 2 is supported by, for example, the NAND interface standard. For example, in the communication between the memory device 1 and the memory controller 2, a command latch enable signal CLE, an address latch enable signal ALE, a write enable signal WEn, a read enable signal REn, a ready busy signal RBn, and an input/output signal IO are used.

The command latch enable signal CLE is a signal indicating that the input/output signal IO received by the memory device 1 is a command CMD. The address latch enable signal ALE is a signal indicating that the signal IO received by the memory device 1 is address information ADD. The write enable signal WEn is a signal for instructing the memory device 1 to input an input/output signal IO. The read enable signal REn is a signal for instructing the memory device 1 to output an input/output signal I/O.

The ready/busy signal RBn is a signal for notifying the memory controller 2 whether the memory device 1 is in a ready state in which an instruction from the memory controller 2 is received or is in a busy state in which an instruction is not received. The input/output signal IO is, for example, an 8-bit width signal, and may include a command CMD, address information ADD, data DAT, and the like.

The memory device 1 and the memory controller 2 may constitute one semiconductor device (memory system or storage device) by a combination thereof. Examples of such a semiconductor device include a memory card such as an SD™ card and a solid state drive (SSD).

In the NAND flash memory 1 according to the embodiment, a control unit referred to as a plane may be formed by a configuration (control unit) including the memory cell array 10, the row control circuit 15, and the sense amplifier circuit 16. FIG. 1 shows an example in which the NAND flash memory 1 has one plane. However, the NAND flash memory 1 may include two or more planes. The configuration of the plane is not limited to the above configuration, and the plane only needs to include at least the memory cell array 10.

<Circuit Configuration>

Figure 2:
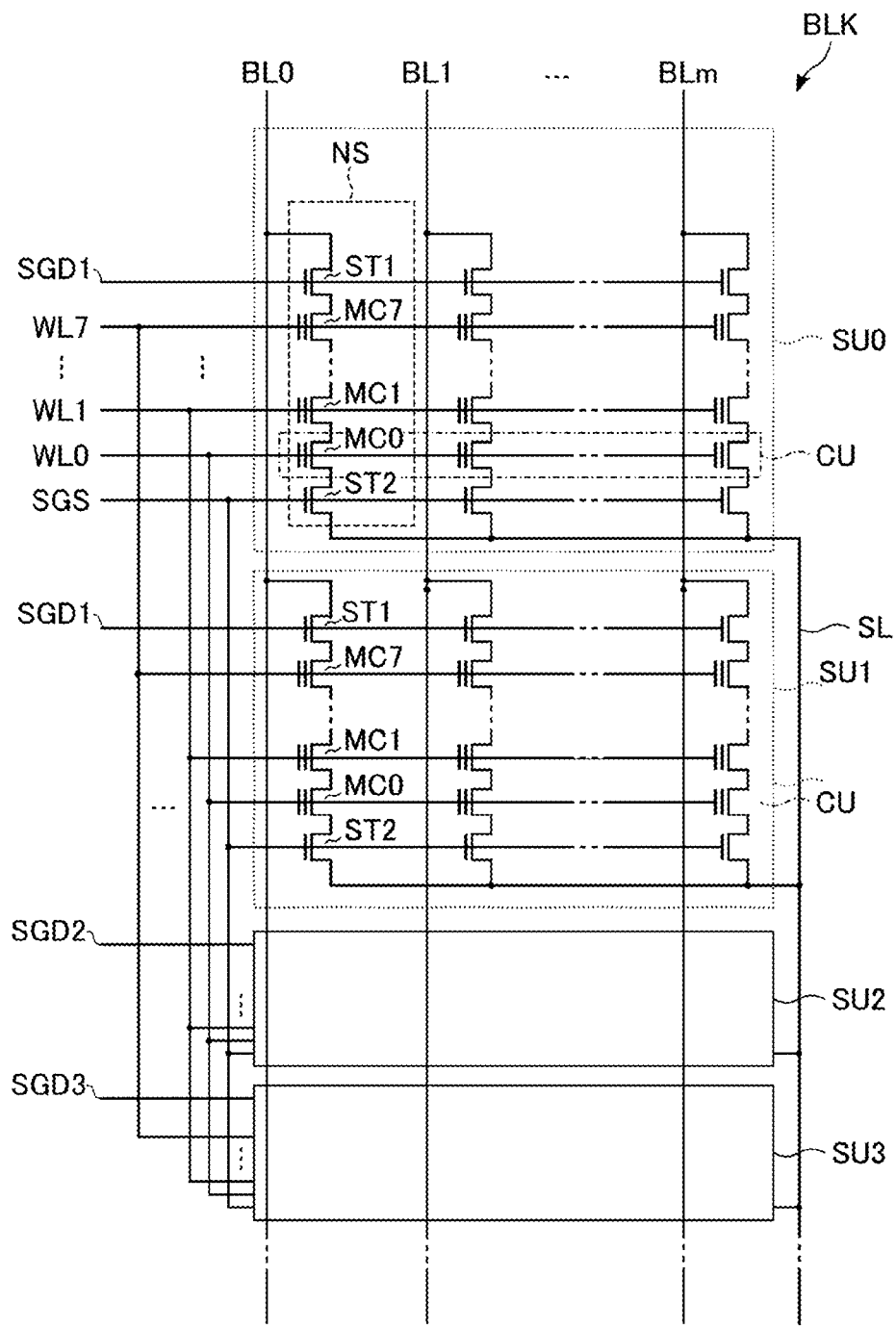
FIG. 2 is an equivalent circuit diagram of a memory cell array of the memory device according to the embodiment.

FIG. 2 is an equivalent circuit diagram showing an example of a circuit configuration of the memory cell array 10 of the memory device (NAND flash memory) 1 according to the embodiment. In FIG. 2, one block BLK is extracted from the plurality of blocks BLK in the memory cell array 10.

As shown in FIG. 2, the block BLK includes, for example, four string units SU0, SU1, SU2, and SU3. Each string unit SU includes a plurality of memory cell strings (hereinafter, referred to as NAND strings) NS. Each of the plurality of NAND strings NS is associated with a corresponding one of a plurality of bit lines BL0 to BLm (m is an integer of 1 or more).

The NAND string NS includes a plurality of memory cells MC0 to MC7 and select transistors ST1 and ST2.

For example, eight memory cells MC are provided in each NAND string NS. The number of memory cells MC in the NAND string NS is not limited to eight.

For example, each select transistor ST1 may include one or more transistors.

A memory cell (hereinafter, also referred to as a memory cell transistor) MC is a field effect transistor including a charge storage layer. The memory cell MC can store data of 1 bit or more substantially in a nonvolatile manner.

Each of the select transistors ST1 and ST2 is used to select the string unit SU during various operations.

In each NAND string NS, the memory cells MC0 to MC7 are coupled in series between the source of the select transistor ST1 and the drain of the select transistor ST2. Control gates of the memory cells MC0 to MC7 in the same block BLK are commonly coupled to a corresponding one of a plurality of word lines WL0 to WL7.

In each NAND string NS, the drain of the select transistor ST1 is coupled to the corresponding bit line BL.

One end of the select transistor ST1 is coupled to one end of the memory cells MC0 to MC7 coupled in series, and the other end of the select transistor ST1 is coupled to the corresponding bit line BL.

The gate of the select transistor ST1 is coupled to a corresponding select gate line SGD.

The gate of the select transistor ST1 in the string unit SU0 is coupled to a select gate line SGD0. The gate of the select transistor ST1 in the string unit SU1 is coupled to a select gate line SGD1. The gate of the select transistor ST1 in the string unit SU2 is coupled to a select gate line SGD2. The gates of the select transistors ST1 in the string unit SU3 are coupled to a select gate line SGD3, respectively.

The sources of a plurality of select transistors ST2 in the same block BLK are commonly coupled to a source line SL. The gates of the plurality of select transistors ST2 in the same block BLK are commonly coupled to a select gate line SGS.

In the circuit configuration of the memory cell array 10 described above, the drains of the select transistors ST1 corresponding to the same column among the plurality of blocks BLK are coupled to the same bit line BL. For example, the source line SL is commonly coupled between the plurality of blocks BLK.

A plurality of memory cells MC coupled to a common word line WL in one string unit SU are referred to as, for example, a cell unit CU.

For example, when each of the memory cells MC stores 1-bit data, one cell unit CU can store one page data, and when each of the memory cells MC stores 2-bit data, one cell unit CU can store two page data. "One page data" is defined by the total amount of data stored in a cell unit CU composed of memory cells MC storing 1-bit data, for example.

The circuit configuration of the memory cell array 10 of the memory device 1 of the embodiment is not limited to the above-described configuration. For example, the number of memory cells MC and select transistors ST1 and ST2 in each NAND string NS may be any number. The number of string units SU in each block BLK may be any number.

<Example of Structure>

An example of the structure of the memory device (NAND flash memory) according to the embodiment will be described with reference to FIGS. 3 and 5.

As will be described below, in the NAND flash memory 1 of the embodiment, the memory cell array 10 is provided above the surface (XY plane and upper surface) of the semiconductor substrate in a direction (Z direction) perpendicular to the surface of the semiconductor substrate. The X and Y directions may be referred to as surface directions of the semiconductor substrate, and the Z direction may be referred to as a thickness direction of the semiconductor substrate.

For example, the NAND flash memory 1 of the present embodiment may have a structure in which a circuit (hereinafter, referred to as CMOS circuit or peripheral circuit) such as the sense amplifier circuit 16 is provided between the surface of the semiconductor substrate and the memory cell array 10 (below the memory cell array 10 in the Z direction).

In the drawings referred to below, the X direction corresponds to the extending direction of the word line WL, the Y direction corresponds to the extending direction of the bit line BL, and the Z direction corresponds to a direction perpendicular to the upper surface of the semiconductor substrate 20 on which the semiconductor memory 1 is formed.

In the cross-sectional views referred to below, components such as an insulating layer (interlayer insulating film), wiring, and contacts are omitted as appropriate for visibility and simplification of the drawings. In the plan view, hatching is appropriately added for visibility of the drawing and identification of the components. The hatching added to the plan view is not necessarily related to the material and characteristics of the components to which the hatching is added.

(Planar Layout of Memory Cell Array)

Figure 3:
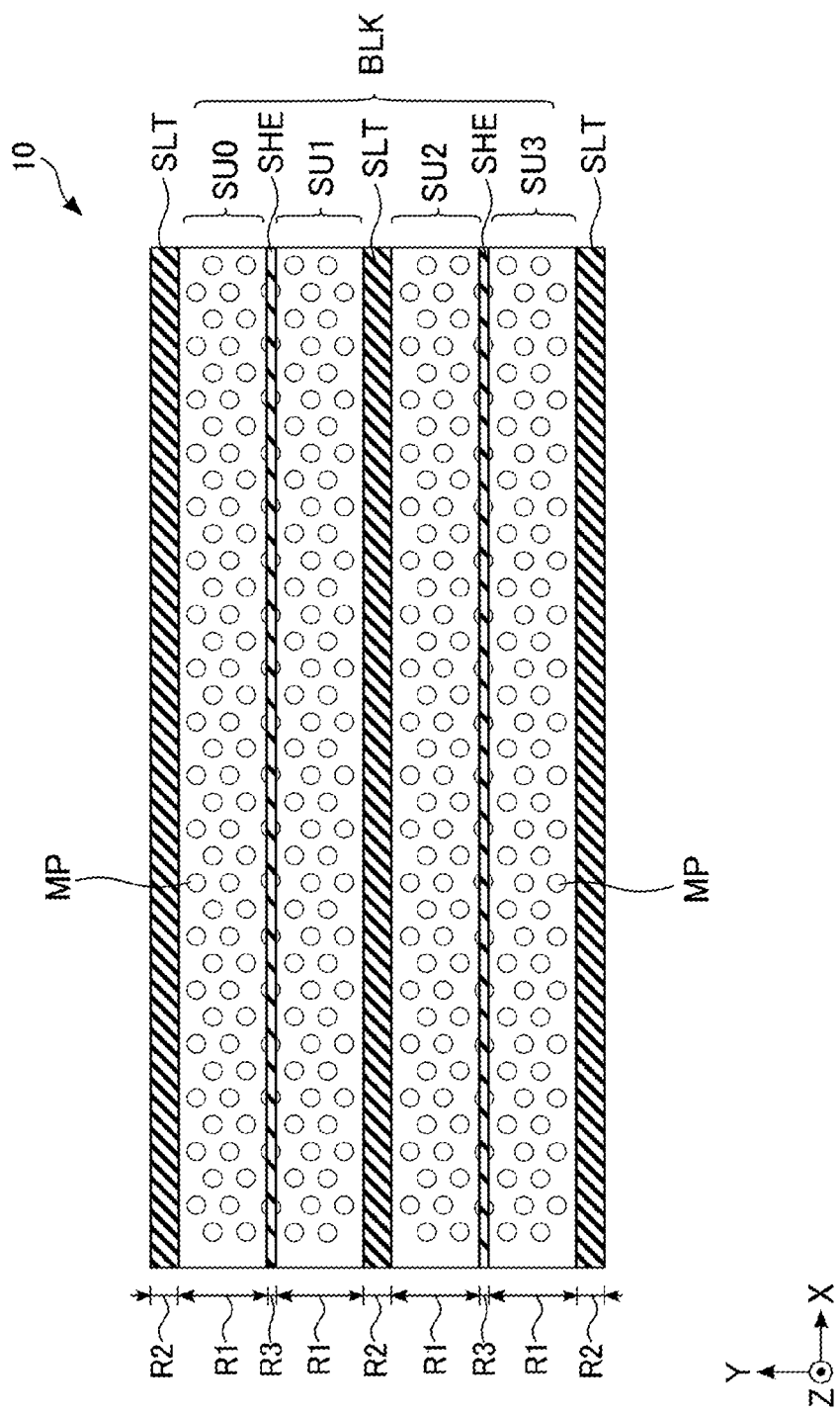
FIG. 3 is a diagram showing an example of a layout of the memory cell array of the memory device according to the embodiment.

FIG. 3 illustrates an example of a planar layout of the memory cell array of the NAND flash memory according to the embodiment. In FIG. 3, one block of the memory cell array is extracted and shown.

As shown in FIG. 3, a plurality of slits SLT are provided in the memory cell array 10. The slit SLT includes a portion extending in the X direction. For example, an insulator is provided in the slit SLT.

A slit SHE is provided between two slits SLT arranged in the Y direction. The slit SHE includes a portion extending in the X direction. For example, an insulator is provided in the slit SHE.

A plurality of memory pillars MP are provided in the memory cell array 10. For example, the plurality of memory pillars MP are arranged in the memory cell array 10 in a staggered manner. The memory pillar MP has a columnar (or elliptical columnar) structure. For example, one memory pillar MP is used for one NAND string NS.

A set of a plurality of memory pillars MP in a region between the slit SLT and the slit SHE corresponds to one string unit SU.

The string unit SU extends along the X direction. The string units SU0 to SU3 are arranged in the Y direction.

In one block BLK, one slit SLT is provided between two string units SU1 and SU2 between two slits SHE. The two string units SU are provided between the two slits SLT in the Y direction. A slit SHE is provided between the two string units SU between the two slits SLT.

The plurality of memory pillars MP are arranged in a staggered manner in a region between the slit SLT and the slit SHE. In the following, a region R1 (the region between the two slits SLT) where the memory pillar is provided is referred to as a cell region R1. A region R2 where the slit SLT (insulator 60) is provided is referred to as a slit region R2. The slit region R2 includes a portion adjacent to the cell region R1 in the Y direction. A region R3 where the slit SHE is provided is referred to as a dummy region R3. The dummy region R3 may be regarded as a part of the cell region R1.

For example, a hookup region (not shown) is provided in the memory cell array 10 so as to be adjacent to the cell region in the X direction. The hookup region is a region where plurality of contact plugs are provided. The contact plugs in the hookup region electrically couple the select gate lines SGD and SGS coupled to the NAND string NS, the word line WL, the source line SL, and the wiring coupled to the memory cell array 10 to the CMOS circuit.

For example, dummy cells may be provided in the memory cell array 10. The dummy cell has substantially the same structure as the memory cell. The dummy cell is formed by using a dummy pillar. The dummy pillar has substantially the same structure as the memory pillar MP. The dummy cell is not used for data storage.

(Cross-Sectional Structure of Memory Cell Array)

Figure 4:
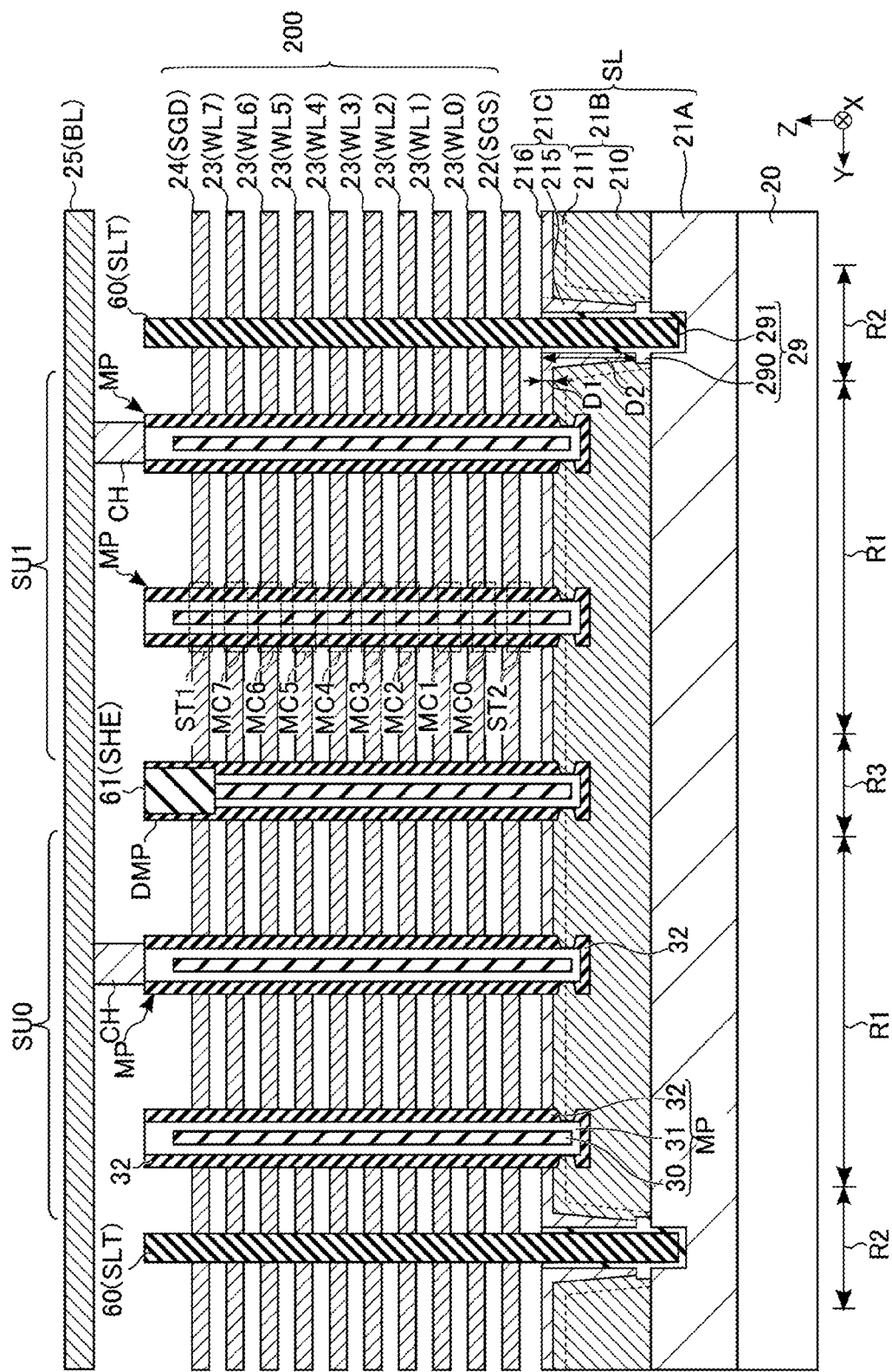
FIG. 4 is a cross-sectional diagram showing a structure of the memory cell array of the memory device according to the embodiment.

FIG. 4 illustrates an example of a cross-sectional structure of the memory cell array of the NAND flash memory according to the embodiment. FIG. 4 shows a cross-sectional structure along the Y direction of the memory cell array.

As shown in FIG. 4, conductive layers 21A, 21B, 21C, 22, 23, and 24 are stacked above a semiconductor substrate 20 in the Z direction.

The conductive layer 21A is provided above the semiconductor substrate 20 via an insulator (not shown).

The conductive layer 21B is provided on the conductive layer 21A. For example, the conductive layer 21B is in direct contact with the conductive layer 21A. For example, the conductive layer 21B includes a first layer 210 and a second layer 211. The two layers 210 and 211 may be continuous layers or non-continuous layers (layers having an interface between the layers 210 and 211).

A conductive layer 21C is provided on the conductive layer 21B. In the slit region R2, the conductive layer 21C faces the side surface (surface intersecting the Y direction) of the conductive layer 21B. For example, the conductive layer 21C is in direct contact with the layer 211 of the conductive layer 21B.

The conductive layer 21C has a different dimension (film thickness) in the Z direction between the cell region R1 and the slit region R2. The conductive layer 21C has a portion 215 in the cell region R1 and a portion 216 in the slit region R2.

A dimension D2 of the conductive layer 21C (portion 216) in the slit region R2 in the Z direction is larger than the dimension D1 the conductive layer 21C (portion 215) in the cell region R1 in the Z direction. The portion having the dimension D2 of the conductive layer 21C covers the side surface of the conductive layer 21B.

The conductive layers 21A, 21B, and 21C are electrically coupled to each other. The conductive layers 21A, 21B, and 21C have, for example, a plate-like structure that spreads along the XY plane.

The conductive layers 21A, 21B, and 21C are used as source lines SL (or source line contacts).

For example, the conductive layers 21A and 21C are also used as etching stopper layers in the process of forming the memory cell array 10.

The conductive layers 21A, 21B, and 21C are semiconductor layers. For example, the dopant concentration (impurity concentration) of the conductive layer 21A is lower than the dopant concentration of the conductive layer 21B. The impurity concentration of the conductive layer 21A may be different from the dopant concentration of the conductive layer 21C.

The conductive layers 21A and 21C are, for example, non-doped polysilicon layers. The conductive layer 21B is, for example, a conductive silicon layer (for example, a polysilicon layer doped with phosphorus). At least one of the materials of the conductive layers 21A and 21C may be the same as the material (for example, conductive polysilicon) of the conductive layer 21B.

As described above, below the memory cell array 10 in the Z direction, a CMOS circuit (not shown) such as a row control circuit and a sense amplifier circuit is provided in an insulator (not shown) between the upper surface of the semiconductor substrate 20 and the conductive layer 21A.

The conductive layer 22 is provided on the conductive layer 21C via an insulating layer (not shown). The conductive layer 22 has, for example, a plate-like structure that spreads along the XY plane. The conductive layer 22 is used as the select gate line SGS. The conductive layer 22 is, for example, a metal layer (for example, a tungsten layer or a layer containing tungsten).

A plurality of conductive layers 23 are provided above the conductive layer 22. The conductive layers 23 and insulating layers (not shown) are alternately stacked on the conductive layer 22 in the Z direction. The conductive layer 23 has, for example, a plate-like structure that spreads along the XY plane. The plurality of stacked conductive layers 23 are used as the word lines WL0 to WL7 in order from the semiconductor substrate 20 side. The conductive layer 23 is, for example, a metal layer (tungsten layer or a layer containing tungsten).

One or more conductive layers 24 are provided above the uppermost conductive layer 23 (the layer located on the most opposite side with respect to the semiconductor substrate side). The conductive layers 24 and insulating layers (not shown) are alternately stacked on the uppermost conductive layer 23 in the Z direction. The conductive layer 24 has, for example, a plate-like structure that spreads along the XY plane. The conductive layer 24 is, for example, a metal layer (tungsten layer or a layer containing tungsten).

The conductive layers 22, 23, and 24 may be conductive polysilicon layers, for example.

Hereinafter, the structure including the conductive layers 22, 23 and 24 and the insulating layers is referred to as a stacked body 200.

The conductive layer 25 is provided above the conductive layer 24 in the Z direction via an insulating layer (not shown). The conductive layer 25 has a linear structure extending along, for example, the Y direction. The conductive layer 25 is used as the bit line BL. The plurality of conductive layers 25 are arranged in the X direction (the depth direction or the front direction in the drawing). The conductive layer 25 is a metal layer (for example, copper (Cu)).

The memory pillar MP has a columnar structure extending along the Z direction. The memory pillar MP passes through the stacked body 200 (a plurality of stacked conductive layers 22, 23, and 24).

For example, the upper end of the memory pillar MP in the Z direction is disposed in a region between the region (height) where the conductive layer 24 is provided and the region where the conductive layer 25 is provided in the Z direction.

The lower end of the memory pillar MP in the Z direction is provided in the source line SL. For example, the lower end of the memory pillar MP is disposed in a region where the conductive layer 21B is provided in the Z direction. The lower end of the memory pillar MP is in contact with the conductive layer 21B without penetrating the conductive layer 21B. The conductive layer 21B is provided between the lower end of the memory pillar MP and the conductive layer 21A.

The lower end of the memory pillar MP is an end portion on the semiconductor substrate 20 side in the Z direction of the memory pillar, and the upper end of the memory pillar MP is an end portion facing the lower end of the memory pillar MP in the Z direction.

The side surface of the memory pillar MP (the surface along the Z direction of the memory pillar MP) faces the conductive layers 22, 23, and 24 (and the insulating layers).

The memory pillar MP includes, for example, a core layer 30, a semiconductor layer (conductive layer) 31, and a memory layer 32.

The core layer 30 has a columnar structure extending along the Z direction. For example, the upper end of the core layer 30 is disposed in a region between the region where the uppermost conductive layer 24 is provided and the region where the conductive layer 25 is provided. For example, the lower end of the core layer 30 is disposed in a region where the conductive layer 21B is provided. The core layer 30 includes an insulator such as silicon dioxide ($SiO_2$), for example.

The semiconductor layer 31 is provided between the core layer 30 and the memory layer 32. The semiconductor layer 31 has a portion in direct contact with the conductive layer 21B in the region where the conductive layer 21B is provided. By this portion, the semiconductor layer 31 is electrically coupled to the conductive layer 21B.

For example, the semiconductor layer 31 covers the core layer 30. The side surface and the lower surface of the semiconductor layer 31 are covered with the memory layer 32 except for a portion where the semiconductor layer 31 is in contact with the conductive layer 21B. The upper end of the core layer 30 may not be covered with the semiconductor layer 31.

The semiconductor layer 31 (hereinafter, also referred to as a conductive layer) is, for example, a layer containing silicon (for example, a polysilicon layer or an amorphous silicon layer).

The memory layer 32 is provided between the stacked body 200 and the semiconductor layer 31. A side surface (surface along the Z direction) of the memory layer 32 faces the conductive layers 22, 23, and 24. An opening is provided in the memory layer 32 in a region where the semiconductor layer 31 is in contact with the conductive layer 21B. The semiconductor layer 31 is provided between the lower end (bottom portion) of the core layer 30 and the memory layer 32.

The memory layer 32 is a stacked film including a plurality of layers. The structure of the memory layer 32 will be described with reference to FIG. 5.

Figure 5:
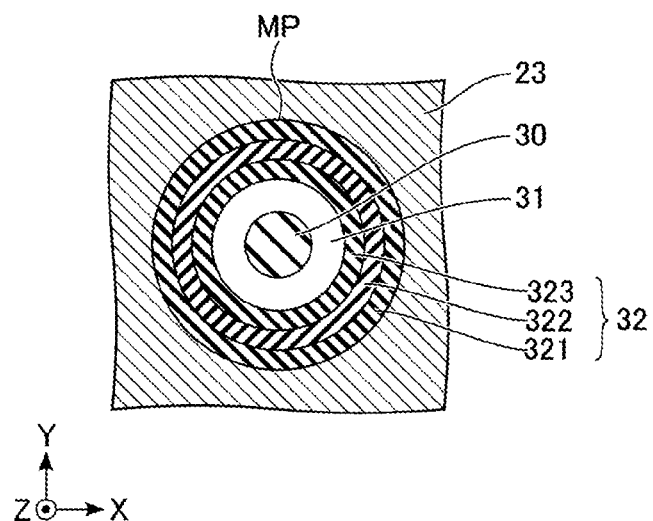
FIG. 5 is a diagram showing an example of a structure of the memory cell of the memory device of the embodiment.

FIG. 5 shows an example of a cross-sectional structure of the memory pillar in a cross section parallel to the upper surface of the semiconductor substrate 20.

As shown in FIG. 5, the memory pillar MP has a circular (or elliptical) planar shape.

In the region including the conductive layer (word line) 23, the core layer 30 is provided at the center of the memory pillar MP. The semiconductor layer 31 is provided between the side surface of the core layer 30 and the memory layer 32. The memory layer 32 is provided between the side surface of the semiconductor layer 31 and the conductive layer 23. The memory layer 32 includes, for example, an insulating layer 321, a charge storage layer 322, and an insulating layer 323.

The charge storage layer 322 is provided between the two insulating layers 321 and 323. The charge storage layer 322 covers the side surfaces of the insulating layers 321 and 323.

An amount of charges corresponding to data to be stored is stored in the charge storage layer 322. For example, as the charge storage layer 322, a charge trap film (for example, a silicon nitride film) including trap levels is used. With respect to the charge storage layer 322 using the charge trap film, charges are trapped in trap levels in the charge storage layer 322. The threshold voltage of the memory cell MC changes depending on the amount of charges in the charge storage layer 322.

An insulating layer 321 (hereinafter, also referred to as a block insulating layer) is provided between the charge storage layer 322 and the conductive layer 23. The block insulating layer 321 is provided between the charge storage layer 322 and the conductive layer 23. The block insulating layer 321 covers the side surface of the charge storage layer 322. The block insulating layer 323 is in contact with the conductive layer 23.

The block insulating layer 321 prevents electrons from moving between the charge storage layer 322 and the conductive layer 23 as a potential barrier. For example, the block insulating layer 321 is an insulating oxide film (for example, an aluminum oxide film).

The insulating layer 323 (hereinafter, also referred to as a gate insulating layer or a tunnel insulating layer) is provided between the semiconductor layer 31 and the charge storage layer 322. The gate insulating layer 323 covers the side surface of the semiconductor layer 31. The gate insulating layer 323 is in contact with the semiconductor layer 31.

The gate insulating layer 323 functions as a gate insulating layer of the memory cell MC. The gate insulating layer 323 functions as a tunnel barrier between the charge storage layer 322 and the semiconductor layer 31. For example, the gate insulating layer 323 is formed by using an insulating oxide layer (for example, a silicon oxide film).

Each of the layers 321, 322, and 323 is continuous from the top to the bottom of the stacked body 200 in the Z direction. Each of the layers 321, 322, and 323 is provided between the stacked body 200 and the semiconductor layer 31 in the memory hole.

Returning to FIG. 4, regarding the relationship between the memory pillar MP and the NAND string NS, for example, a select transistor ST2 is provided in a portion where the memory pillar MP faces the conductive layer 22. A memory cell MC is provided in a portion where the memory pillar MP faces the conductive layer 23. The select transistor ST1 is provided in a portion where the memory pillar MP faces the conductive layer 24. The conductive layer (semiconductor layer) 31 in the memory pillar MP functions as a channel region of each of the memory cell MC and the select transistors ST1 and ST2.

A contact plug CH is provided between the memory pillar MP and the conductive layer 25. The contact plug CH is, for example, a metal layer. The upper end of the contact plug CH is in contact with one conductive layer 25 (bit line BL). The lower end of the contact plug CH is in contact with the upper end of the semiconductor layer 31. As a result, the bit line BL is electrically coupled to the NAND string NS (memory pillar MP).

In the region R3, an insulator 61 is provided in the slit SHE. The insulator 61 in the slit SHE includes, for example, silicon oxide.

The insulator 61 has a plate-like structure extending along the XZ plane. The conductive layer 24 is divided in the Y direction by the insulator 61 (and the slit SHE). The insulator 61 covers the upper end of the semiconductor layer 31.

For example, the upper end of the insulator 61 is disposed in a region between the region where the upper end of the memory pillar MP is provided and the region where the conductive layer 25 is provided. For example, the lower end of the insulator 61 is disposed between a region where the uppermost conductive layer 23 is provided and a region where the conductive layer 24 is provided. For example, a portion where the memory pillar DMP below the insulator 61 faces the conductive layer 23 is a dummy cell.

The region R2 where the slit SLT is provided is provided in the block BLK at a certain cycle, for example. A plurality of slit regions R2 are arranged in the Y direction. The slit region R2 may have a portion extending in the Y direction so as to couple a plurality of portions extending in the X direction of the slit region R2.

The insulator 60 is provided in the slit SLT. The insulator 60 in the slit SLT includes, for example, silicon oxide (for example, SiO$_2$).

The insulator 60 has a plate-like structure extending along the XZ plane. The insulator 60 extends in the Z direction between the stacked body 200 and the source line SL.

The side surface of the insulator 60 faces the conductive layers 22, 23, and 24 (stacked body 200). For example, the conductive layers 22, 23, and 24 are divided in the Y direction by the insulator 60.

For example, the upper end of the insulator 60 is disposed in a region between the region including the upper end of the memory pillar MP and the region where the conductive layer 25 is provided. The lower end of the insulator 60 is disposed, for example, in a region where the conductive layer 21A is provided.

The lower end of the insulator 60 is provided in the source line SL. The lower end of the insulator 60 (and the slit SLT) is disposed, for example, in a region (height) where the conductive layer 21A is provided without penetrating the conductive layer 21A.

For example, a portion of the insulator 60 (a portion of the insulator 60 in the source line SL) in a region (height) below the lower end of the stacked body 200 is covered with an insulating layer 29. The conductive layers 21A, 21B, and 21C face the side surface of the insulator 60 with the insulating layer 29 interposed therebetween. The insulating layer 29 is provided between the conductive layers 21A, 21B, 21C and the insulator 60. The insulating layer 29 is provided between the lower end (bottom portion) of the insulator 60 and the upper surface of the conductive layer 21A.

For example, the position of the lower end of the insulator 60 (the lower end of the slit SLT) in the Z direction is provided closer to the semiconductor substrate 20 than the position of the lower end of the memory pillar MP in the Z direction.

The dimensions (length and height) of the insulator 60 in the Z direction are larger than the dimensions of the memory pillar MP in the Z direction.

The insulating layer 29 includes a first portion 290 and a second portion 291. The insulating layer 29 is a layer containing, for example, silicon oxide.

The first portion 290 covers the side surface and the bottom surface of the insulator 60 in the region where the conductive layers 21A, 21B, and 21C are provided.

The second portion 291 (hereinafter, also referred to as a protruding portion) is provided, for example, in a region where the conductive layer 21B is provided (region in the vicinity of the boundary between the conductive layer 21B and the conductive layer 21A). The second portion 291 protrudes from the first portion 290 in the Y direction. For example, the second portion 291 is provided between the conductive layer 21A and the conductive layer 21C in the Z direction. Regarding the position (height) in the Z direction, the second portion 291 is located closer to the semiconductor substrate than the lower end of the memory pillar MP. Regarding the position in the Z direction, the second portion 291 is located on the bit line side (opposite to the semiconductor substrate side) from the lower end of the insulator 60. For example, the second portion 291 separates the conductive layer 21C from the conductive layer 21A.

For example, the conductive layer 24 is separated into four portions by the slits SLT and SHE. The four separated portions in the conductive layer 24 correspond to the string units SU0 to SU3 as the select gate lines SGD, respectively.

(b) MANUFACTURING METHOD

A manufacturing method of the memory device (for example, NAND flash memory) of the present embodiment will be described with reference to FIGS. 6 to 19.

Figure 6:
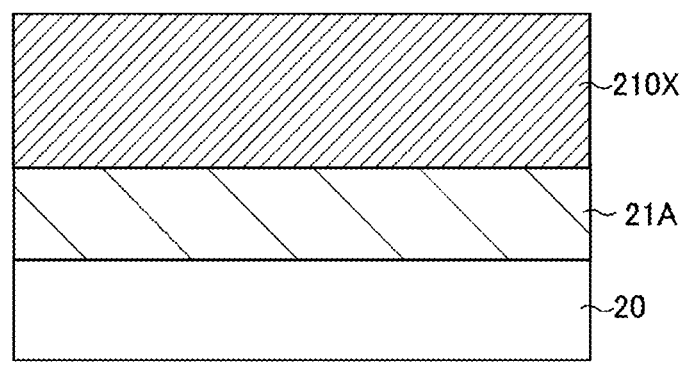
FIG. 6 is a cross-sectional diagram to show a process of a manufacturing method of the memory device according to the embodiment.

FIG. 6 is a cross-sectional diagram to illustrate a process in the manufacturing method of the flash memory according to the present embodiment. In FIG. 6, a cross section (ZY plane) along the Y direction is shown.

As shown in FIG. 6, the conductive layer 21A is formed on an insulator (not shown) that covers the upper surface of the semiconductor substrate 20 by, for example, chemical vapor deposition (CVD). The conductive layer 21A is, for example, a non-doped polysilicon layer.

A conductive layer 210X is formed on the conductive layer 21A by, for example, CVD. The conductive layer 210X is, for example, a conductive polysilicon layer (for example, a polysilicon layer doped with phosphorus).

A CMOS circuit (peripheral circuit) may be formed on the semiconductor substrate 20 before the formation of the conductive layers 21A and 210X. An insulator (not shown) is formed on the semiconductor substrate 20 so as to cover the formed CMOS circuit. The conductive layers 21A and 210X are formed above the semiconductor substrate 20 in the Z direction via the insulator.

Figure 7:
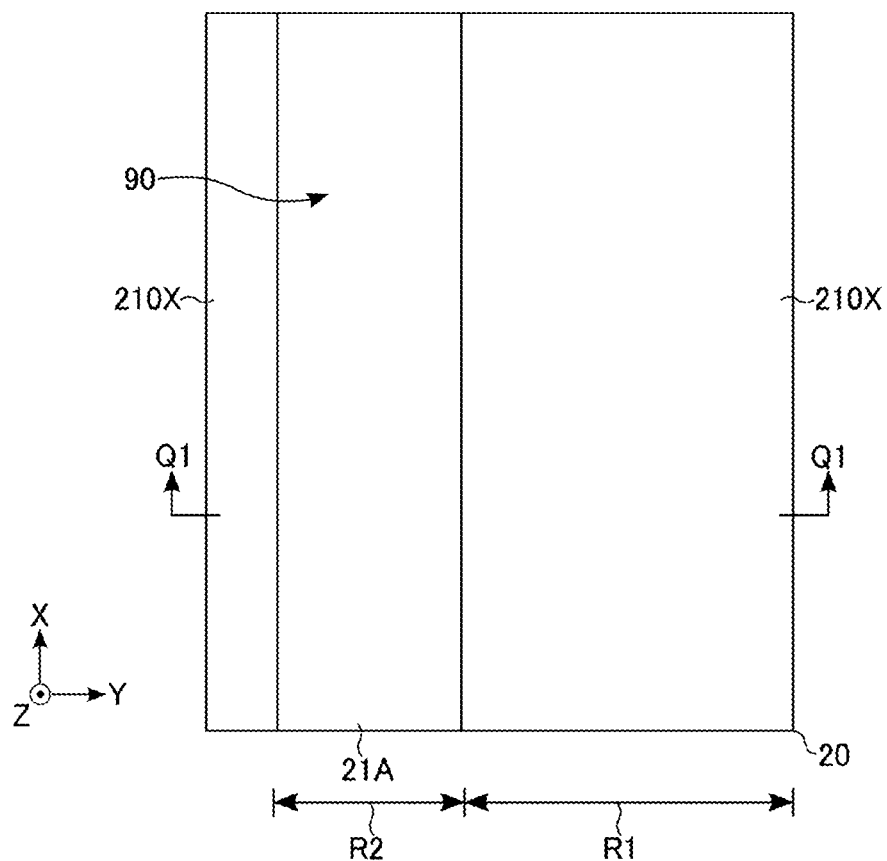
FIG. 7 is a plan view diagram to show a process of the manufacturing method of the memory device according to the embodiment.
Figure 8:
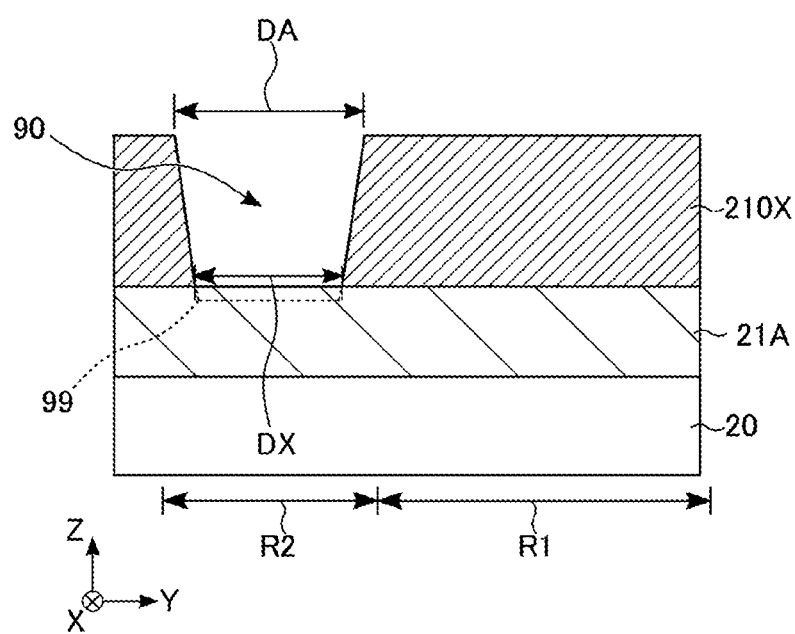
FIG. 8 is a cross-sectional diagram to show a process of the manufacturing method of the memory device according to the embodiment.

FIG. 7 is a top view diagram to illustrate a step in the method of manufacturing the flash memory according to the present embodiment. FIG. 8 is a cross-sectional diagram taken along the line Q1-Q1 in FIG. 7.

As shown in FIGS. 7 and 8, in the slit region R2, an opening 90 (groove) is formed in the conductive layer 210X by well-known photolithography and etching (for example, reactive etching). For example, the opening 90 has a linear shape extending in the X direction. When the opening 90 is formed, the upper surface of the conductive layer 210X in the cell region R1 is covered with a mask layer (not shown). In the present embodiment, the upper surface of various layers such as the conductive layer 210X is a surface facing the surface of the layer on the semiconductor substrate side in the Z direction. The lower surface (bottom surface) of the layer is the surface of the layer on the semiconductor substrate side in the Z direction.

For example, the dimension of the opening 90 in the Y direction is set to "DA". The dimension DA is the dimension of the largest dimension (for example, the upper portion of the opening 90) in the Y direction of the opening 90 when the opening 90 has a tapered cross-sectional shape. In the tapered opening 90, a dimension DX of the bottom portion of the opening 90 in the Y direction is smaller than the dimension DA.

The upper surface of the conductive layer 21A is exposed through the opening 90.

As indicated by a broken line 99 in FIG. 8, the upper surface (exposed surface) of the conductive layer 21A in the opening 90 may recede toward the semiconductor substrate from the boundary (interface) between the conductive layer 21A and the conductive layer 210X. In this case, with respect to the position from the upper surface of the semiconductor substrate 20 in the Z direction, the position of the upper surface (exposed surface) of the conductive layer 21A in the slit region R2 is lower than the position of the upper surface of the conductive layer 21A in the cell region R1 (position of the boundary between the conductive layer 21A and the conductive layer 210X).

Figure 9:
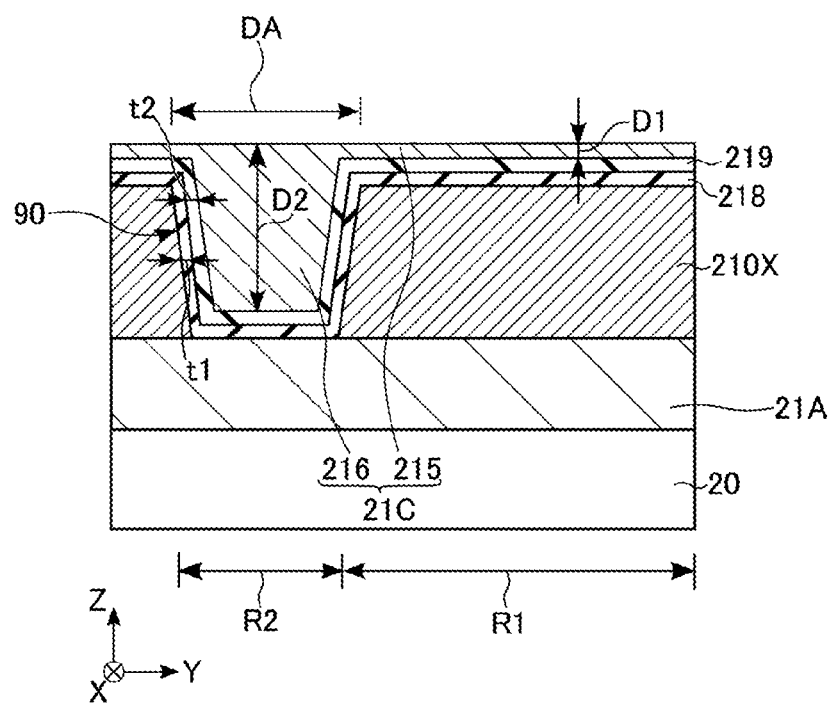
FIG. 9 is a cross-sectional diagram to show a process of the manufacturing method of the memory device according to the embodiment.

FIG. 9 is a cross-sectional diagram to illustrate a process in the manufacturing method of the flash memory according to the present embodiment. In FIG. 9, a cross section along the Y direction (cross section of the ZY plane) is shown.

As shown in FIG. 9, an insulating layer 218 (hereinafter, referred to as a sacrifice layer or a spacer layer) is formed on the conductive layers 21A and 210X by, for example, CVD. Thereby, the sacrifice layer 218 covers the upper surface of the conductive layer 21A exposed through the opening 90 and the side surface (side wall) of the conductive layer 210X. The side surface of the conductive layer 210X is a surface that intersects the Y direction (the direction parallel to the upper surface of the substrate 20).

An insulating layer 219 (hereinafter, referred to as a sacrifice layer or a spacer layer) is formed on the sacrifice layer 218 by, for example, CVD.

The sacrifice layer 218 is, for example, a silicon oxide layer. The sacrifice layer 219 is, for example, a silicon nitride layer. The material of the two sacrifice layers 218 and 219 is not limited to silicon nitride and silicon oxide as long as a desired etching selectivity is achieved between the two sacrifice layers 218 and 219.

Here, a film thickness t1 of the sacrifice layer 218 and a film thickness t2 of the sacrifice layer 219 are controlled so that the opening 90 is not blocked by the sacrifice layers 218 and 219. The film thicknesses t1 and t2 of the sacrifice layers 218 and 219 are set to dimensions (here, dimensions in the Y direction) in the direction parallel to the upper surface (front surface) of the semiconductor substrate 20. In this case, it is preferable that the sacrifice layers 218 and 219 are formed, respectively by controlling the film thicknesses t1 and t2 of the sacrifice layers 218 and 219 so that the dimension "2×(t1+t2)" obtained by doubling the sum of the film thickness t1 and the film thickness t2 is smaller than the dimension DA (maximum dimension in the Y direction) of the opening 90 in the Y direction.

After the formation of the sacrifice layer 219, the conductive layer 21C is formed on the sacrifice layer 219 by, for example, CVD. The conductive layer 21C is embedded in the opening 90. The opening 90 is filled with the conductive layer 21C. The conductive layer 21C covers the upper surface of the conductive layer 21A, the upper surface of the conductive layer 21C, and the side surface of the conductive layer 210X via the sacrifice layers 218 and 219.

For example, the conductive layer 21C is a non-doped polysilicon layer.

The conductive layer 21C has different dimensions in the Z direction between the cell region R1 and the slit region R2. The conductive layer 21C includes the portion 215 in the cell region R1 and the portion 216 in the slit region R2.

The dimension D2 of the portion 216 in the slit region R2 in the Z direction is larger than the dimension D1 of the portion 215 in the cell region R1 in the Z direction.

Figure 10:
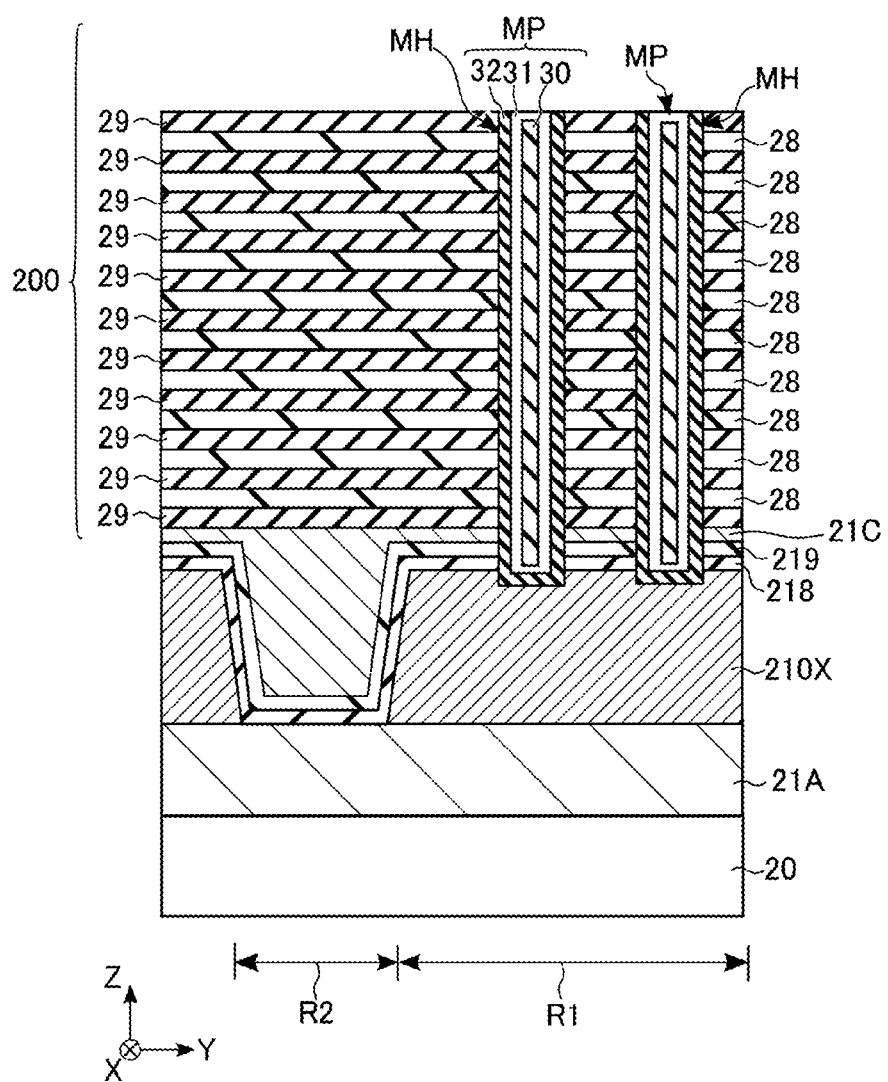
FIG. 10 is a cross-sectional diagram to show a process of the manufacturing method of the memory device according to the embodiment.

FIG. 10 is a cross-sectional diagram to illustrate a process in the manufacturing method of the flash memory according to the present embodiment. In FIG. 10, a cross section along the Y direction (cross section of the ZY plane) is shown.

As shown in FIG. 10, the insulating layer 29 is formed on the conductive layer 21C by, for example, CVD. An insulating layer 28 is formed on the insulating layer 29 by, for example, the CVD method. Thereafter, the insulating layers 29 and the insulating layers 28 are alternately formed in the Z direction.

Thereby, the stacked body 200 including a plurality of insulating layers 28 and 29 is formed above the semiconductor substrate 20 in the Z direction.

For example, the insulating layer 29 is a silicon oxide layer. The insulating layer 28 is, for example, a silicon nitride layer. The material of the layers 28 and 29 is not limited as long as a desired etching selectivity is achieved between the two layers 28 and 29. For example, silicon oxide may be used for the material of the layer 29, and a semiconductor (for example, silicon) may be used for the material of the layer 28.

In the cell region R1, a plurality of holes MH (hereinafter, referred to as memory holes) are formed in the stacked body 200 by photolithography and etching (for example, anisotropic etching). A memory hole MH extends in the Z direction through the stacked body 200. The bottom portion of the memory hole MH reaches the conductive layer 210X. For example, at the position where the hole MH is formed, the upper surface of the conductive layer 210X recedes to the semiconductor substrate 20 side.

The memory layer 32 is formed on the stacked body 200, the sacrifice layers 218 and 219, and the conductive layers 210X and 211X by, for example, CVD. As described above (for example, FIG. 5), the memory layer 32 is a stacked film including three layers. In this case, the charge storage layer 322 is formed on the block insulating layer 321 after the block insulating layer 321 is formed. After the formation of the charge storage layer 322, the gate insulating layer 323 is formed on the charge storage layer 322.

In the hole MH, the memory layer 32 is formed on the side surfaces of the insulating layers 28, 29, 218, and 219, on the side surface of the conductive layer 211X, and on the upper surface of the conductive layer 210X. Thus, the exposed portions of the members 28, 29, 210X, 211X, 218, and 219 corresponding to the shape of the hole MH are covered with the memory layer 32 in the hole MH.

The film thickness of the memory layer 32 is controlled to be formed so that the memory layer 32 does not block the memory hole MH.

The semiconductor layer 31 is formed on the memory layer 32 by, for example, CVD. The semiconductor layer 31 is a silicon layer. The film thickness of the semiconductor layer 31 is controlled to be formed so that the semiconductor layer 31 does not close the hole MH.

The core layer (insulating layer) 30 is formed on the semiconductor layer 31 by, for example, CVD. The formation of the core layer 30 closes the memory hole MH.

For example, chemical mechanical polishing (CMP) or etching back is performed on the core layer 30, the semiconductor layer 31, and the memory layer 32 by using the upper surface of the stacked body 200 as a stopper. The core layer 30, the semiconductor layer 31, and the memory layer 32 are removed from the upper surface of the stacked body 200. For example, the upper end of the core layer 30 is covered with a semiconductor layer continuous with the semiconductor layer 31 by re-forming the conductive layer and heating treatment.

As a result, the memory pillar MP is formed in the memory hole MH. For example, the position of the upper end of the memory pillar MP in the Z direction substantially matches the position of the upper surface of the stacked body 200.

On the lower end side of the memory pillar MP, the side surface of the memory pillar MP (the surface intersecting the X direction or Y direction of the memory pillar MP) is in contact with the sacrifice layers 218 and 219 and the conductive layer 21C. For example, the memory layer 32 on the bottom side of the memory pillar MP is in direct contact with the sacrifice layers 218 and 219 and the conductive layer 21C.

The lower end (bottom portion) of the memory pillar MP is in contact with the conductive layer 210X. For example, the memory layer 32 at the lower end of the memory pillar MP is in direct contact with the conductive layer 210X.

Figure 11:
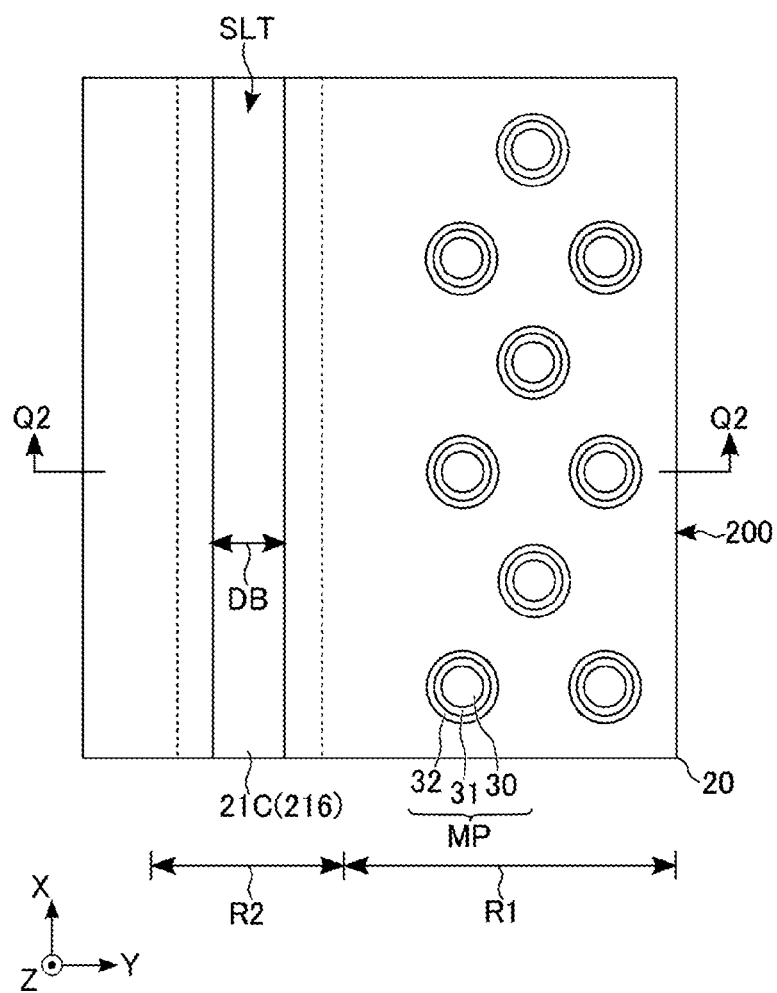
FIG. 11 is a plan view diagram to show a process of the manufacturing method of the memory device according to the embodiment.
Figure 12:
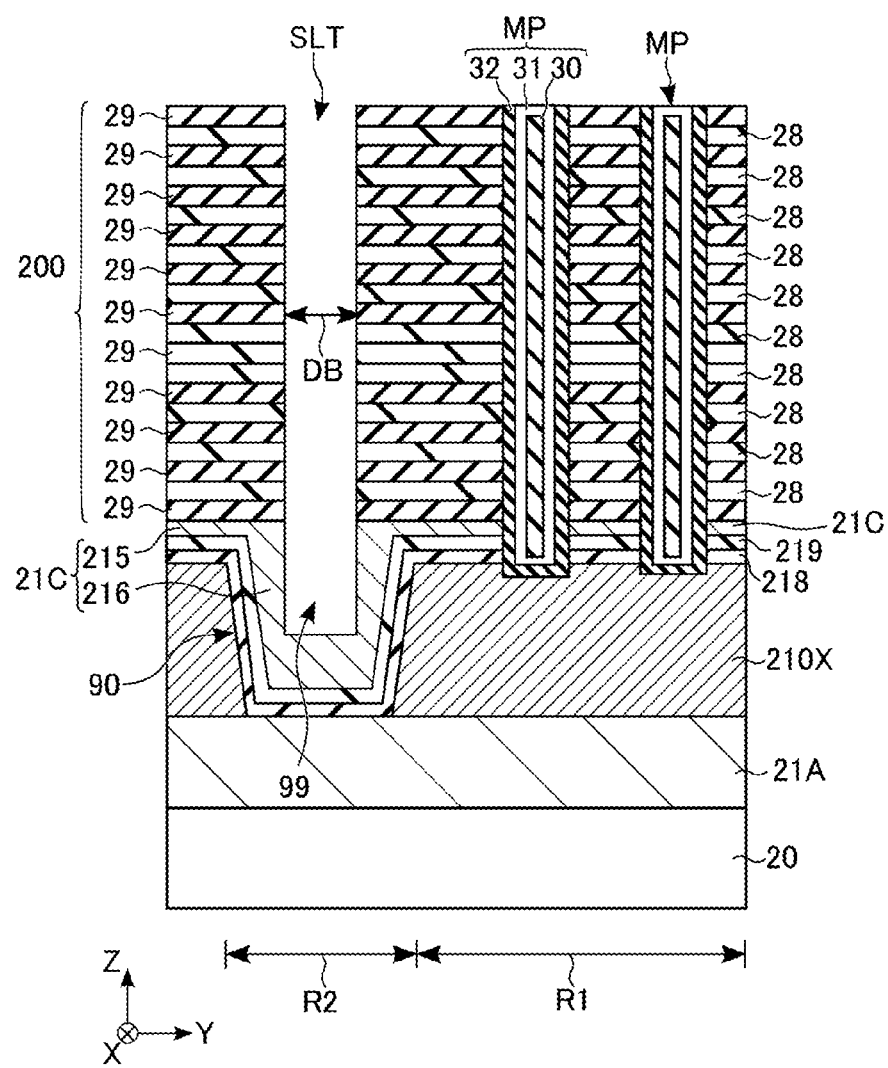
FIG. 12 is a cross-sectional diagram to show a process of the manufacturing method of the memory device of the embodiment.

FIG. 11 is a top view diagram to illustrate a step in the method of manufacturing the flash memory according to the present embodiment. FIG. 12 is a cross-sectional view taken along the line Q2-Q2 of FIG. 11.

As shown in FIGS. 11 and 12, the slit SLT is formed in the slit region R2 by photolithography and etching. In the present embodiment, etching for forming the slit SLT is performed so that the conductive layer 21C remains at the bottom portion of the slit SLT. For example, the conductive layer 21C is used as an etching stopper layer.

The planar shape of the slit SLT viewed from the Z direction is a quadrangular shape (linear shape) extending in the X direction. The cross-sectional shape of the slit SLT viewed from the X direction is a quadrangular shape extending in the Z direction.

The slit SLT extends from the upper surface of the stacked body 200 to the conductive layer 21C in the Z direction. The lower end of the slit SLT in the Z direction is disposed in the conductive layer 21C.

For example, the dimension DB of the slit SLT in the Y direction is equal to or smaller than the dimension DA of the opening 90 of the conductive layer 21A.

The conductive layer 21C is exposed through the slit SLT.

At the position where the slit SLT is formed, the upper surface of the conductive layer 21C recedes to the semiconductor substrate 20 side. In the slit region R2, the groove (concave portion) 99 is formed in the conductive layer 21C.

The upper surfaces of the sacrifice layers 218 and 219 are covered with the conductive layer 21C.

Figure 13:
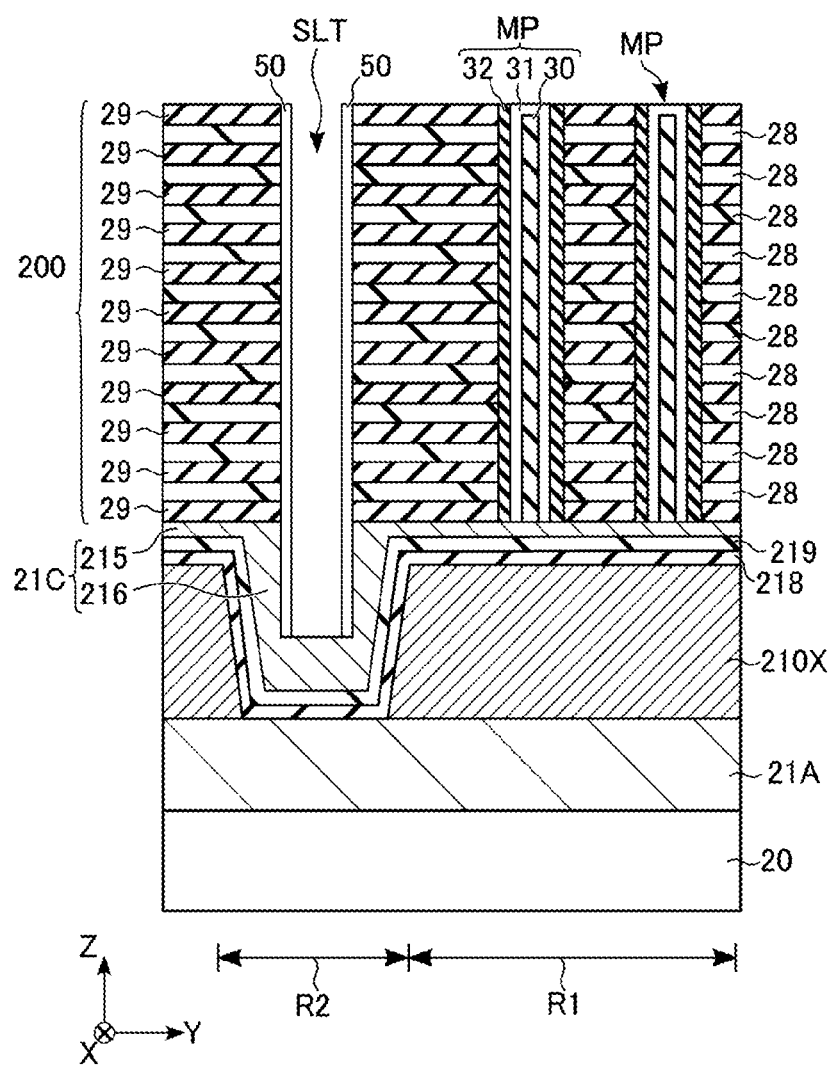
FIG. 13 is a cross-sectional diagram to show showing a process of the manufacturing method of the memory device according to the embodiment.

FIG. 13 is a cross-sectional diagram to illustrate a process in the manufacturing method of the flash memory according to the present embodiment. In FIG. 13, a cross section along the Y direction (cross section of the ZY plane) is shown.

As shown in FIG. 13, the layer 50 (hereinafter, also referred to as a protective layer or a spacer layer) is formed on the stacked body 200 and in the slit SLT, for example, by CVD. The layer 50 is etched back. The layer 50 is removed from the upper surface of the stacked body 200 and the bottom portion (the upper surface of the conductive layer 21C in the slit SLT) of the slit SLT.

As a result, the protective layer 50 remains in a self-aligned manner on the side surfaces of the stacked body 200 (side surfaces of the insulating layers 28 and 29) in the slit SLT and the side surface of the conductive layer 21C. The protective layer 50 extends in the X direction along the side surface of the stacked body 200.

In the slit SLT, the side surfaces of the insulating layers 28 and 29 and the side surface of the conductive layer 21C are covered with the protective layer 50.

The protective layer 50 is a semiconductor layer, for example. As a more specific example, the protective layer 50 is a non-doped polysilicon layer. The material of the protective layer 50 is not limited to silicon as long as the material provides an etching selectivity with respect to other members (for example, the insulating layers 28 and 29 and the conductive layer 211X).

Figure 14:
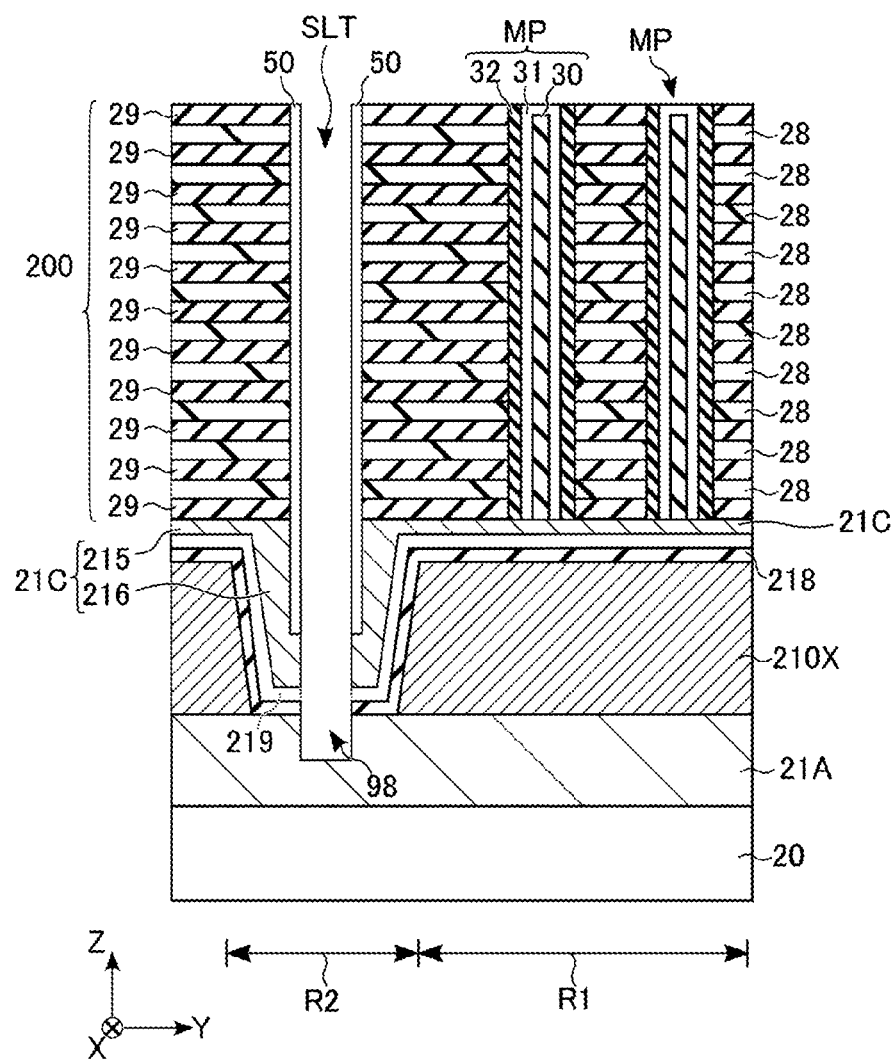
FIG. 14 is a cross-sectional diagram to show a process of the manufacturing method of the memory device according to the embodiment.
Figure 15:
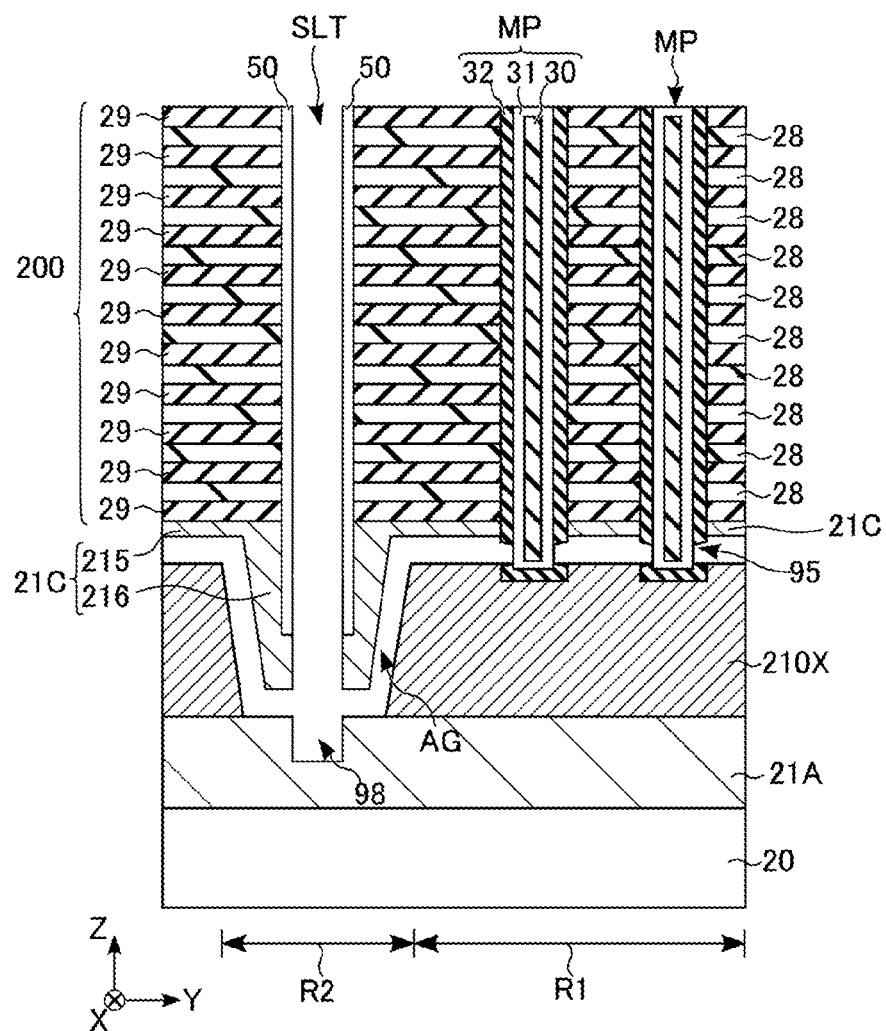
FIG. 15 is a cross-sectional diagram to show a process of the manufacturing method of the memory device according to the embodiment.

FIGS. 14 and 15 are cross-sectional process views showing a process in the manufacturing method of the flash memory according to the present embodiment. In FIGS. 14 and 15, a cross section along the Y direction (cross section of the ZY plane) is shown.

As shown in FIG. 14, the etching on the conductive layer 211X is performed in a state where the protective layer 50 covers the side surfaces of the stacked body 200 and the conductive layer 211X.

As a result, the conductive layer 211X is removed at the position corresponding to the slit SLT in the slit region R2. For example, at the position corresponding to the slit SLT, the upper surface of the conductive layer 21A recedes to the semiconductor substrate 20 side. As a result, a groove 98 is formed in the upper surface (upper portion) of the conductive layer 21A.

By removing the conductive layer 211X, the sacrifice layers 218 and 219 are exposed through the slit SLT.

The sacrifice layer (silicon oxide layer) 218 is removed by wet etching. Thereafter, the sacrifice layer (silicon nitride layer) 219 is removed by wet etching.

As shown in FIG. 15, by removing the two sacrifice layers 218 and 219, an air gap (space) AG is formed between the conductive layer 210X and the conductive layer 21C.

When etching the sacrifice layers 218 and 219, the side surfaces of the stacked body 200 in the slit SLT are covered with the protective layer 50.

Therefore, when the sacrifice layers 218 and 219 are etched, the layers 28 and 29 in the stacked body 200 are not etched.

Figure 16:
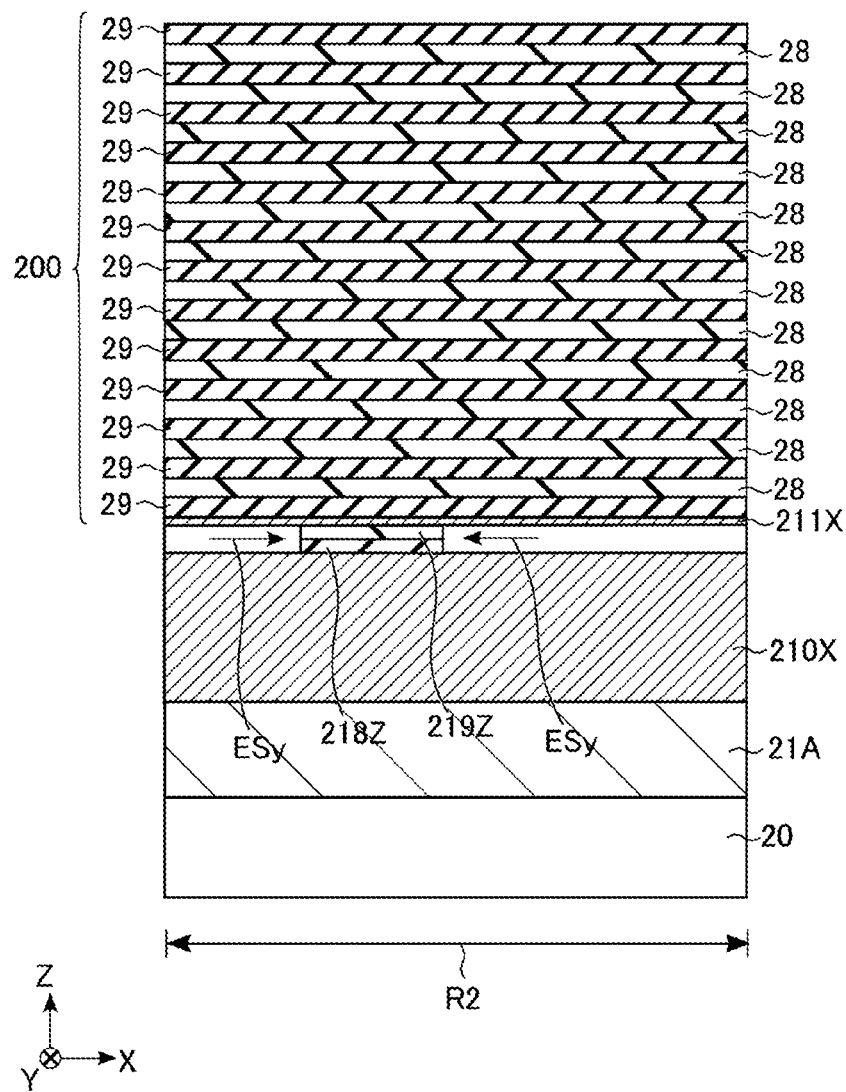
FIG. 16 is a cross-sectional diagram to show a process of the manufacturing method of the memory device according to the embodiment.

FIG. 16 shows the state of etching of the sacrifice layers 218 and 219.

For example, when the slit SLT reaches the conductive layer 21A during formation of the slit SLT (see FIGS. 11 and 12), the protective layer 50 covers the side surfaces of the sacrifice layers 218 and 219. In this case, at the time of removing the sacrifice layers 218 and 219, the etching solution is less likely to flow from the Y direction into the sacrifice layers 218 and 219 whose side surfaces in the Y direction are covered in the protective layer 50 by the protective layer 50. In addition, in a certain portion in the memory cell array 10, the inflow of the etching solution from the Y direction to the sacrifice layers 218 and 219 may be hindered due to the narrow interval between the conductive layer 210X and the conductive layer 21C.

In the present embodiment, the slit SLT extends in the Y direction, and the sacrifice layers 218 and 219 are continuous in the Y direction.

Therefore, as shown in FIG. 15, in the region where the etching solution is not supplied from the X direction, remaining sacrifice layers 218z and 219z can be etched by a supply ESy of the etching solution from the Y direction.

Thus, in the present embodiment, the sacrifice layers 218 and 219 are removed relatively cleanly from the region between the conductive layer 210X and the conductive layer 21C.

The sacrifice layers 219 and 218 may be removed by the same etching solution.

In the present embodiment, the side surface on the lower end side of the memory pillar MP is exposed to the etching solution through the space generated by the removal of the sacrifice layers 218 and 219. The memory layer 32 at the bottom portion of the memory pillar MP is removed by, for example, wet etching for removing the sacrifice layer 219. As a result, an opening 95 is formed on the side surface of the memory pillar MP. An etching solution for removing the memory layer may be supplied after removing the sacrifice layer 218 separately from the etching solution for removing the sacrifice layer 219.

As a result, the conductive layer (semiconductor layer) 31 is exposed to the space between the two conductive layers 210X and 21C through the opening 95 on the side surface of the memory pillar MP.

Figure 17:
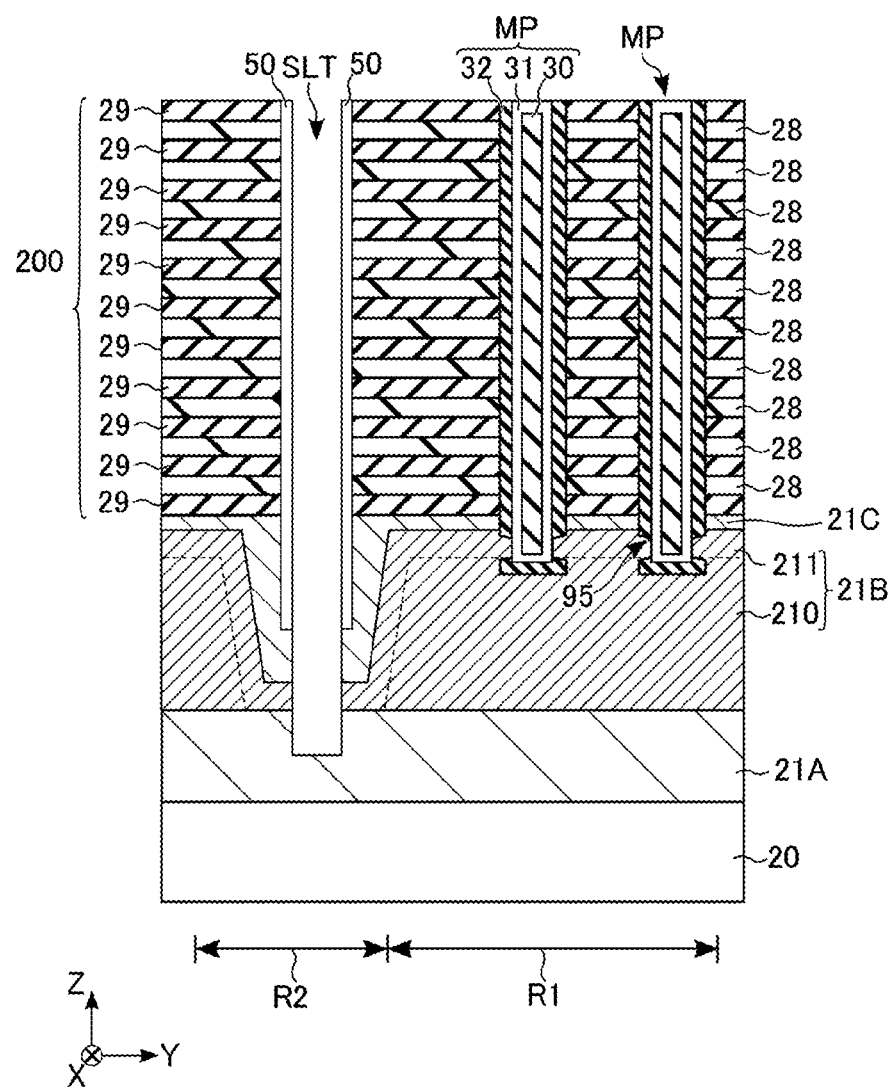
FIG. 17 is a cross-sectional diagram to show a process of the manufacturing method of the memory device of the embodiment.

FIG. 17 is a cross-sectional diagram to illustrate a process in the manufacturing method of the flash memory according to the present embodiment. In FIG. 16, a cross section along the Y direction (cross section of the ZY plane) is shown.

The conductive layer 210 is selectively formed in the space AG between the conductive layer 21C and the conductive layer 210. The supply path of the formation of the conductive layer 210 in the space AG is a path from the upper side of the conductive layer 21A (the bottom portion of the conductive layer 210) to the upper side of the conductive layer 21. For example, selective CVD (supply of the formation of the layer 21) and etching of residual in the space AG are repeatedly performed.

As a result, the conductive layer 211 is embedded between the conductive layer 21C and the conductive layer 210. The conductive layers 21A, 210, 211, and 21C are electrically coupled to each other.

When the conductive layer 211 is a silicon layer, the conductive layer 210 is, for example, a silicon layer. When the conductive layer 210 is formed by selective growth of silicon, the conductive layer 210 and the conductive layer 211 become one continuous layer 21B.

The material of the conductive layer 210 may be different from the material of the conductive layer 211. In this case, a boundary (interface) is formed between the two non-continuous layers 210 and 211.

The conductive layer 211 is formed on the side surface of the semiconductor layer 31 of the memory pillar MP through the opening 95 on the bottom side of the memory pillar MP. The conductive layer 211 is in direct contact with the semiconductor layer 31.

As a result, the conductive layers 21A, 21B, and 21C serving as source lines are electrically coupled to the semiconductor layer 31 of the memory pillar MP.

Figure 18:
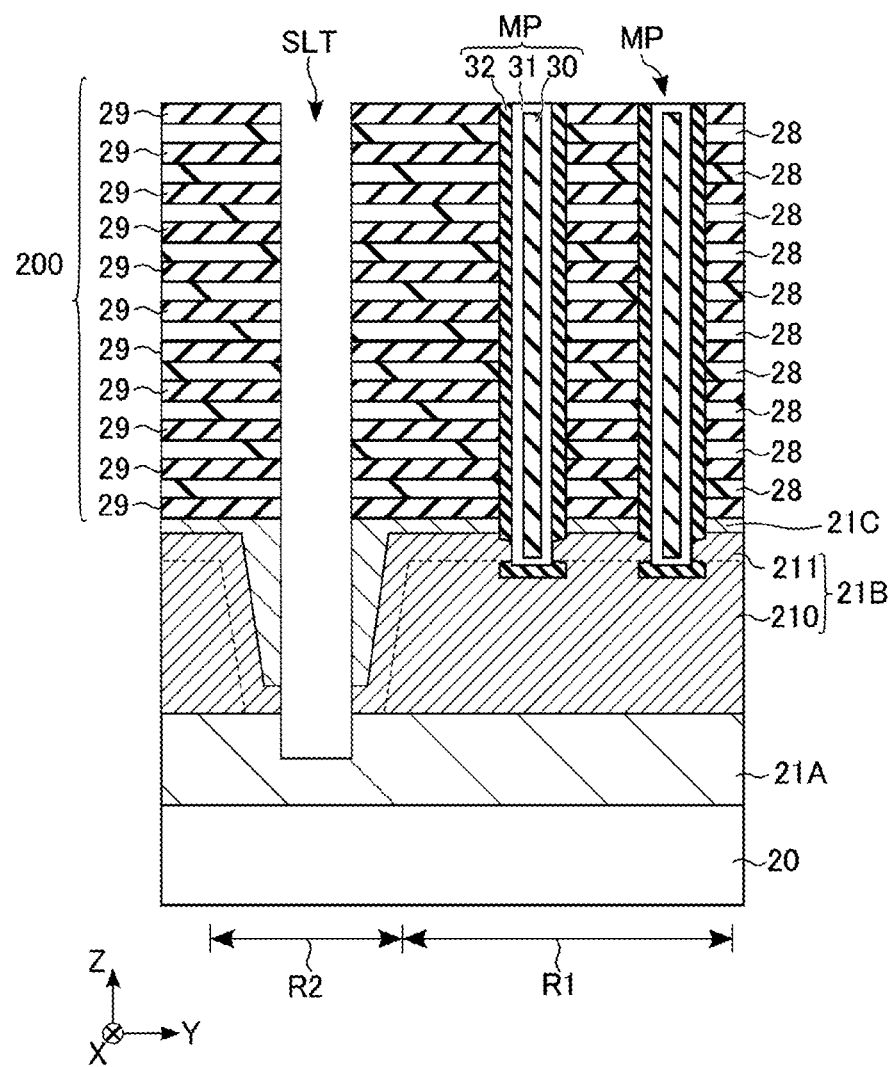
FIG. 18 is a cross-sectional diagram to show a process of the manufacturing method of the memory device according to the embodiment.

FIG. 18 is a cross-sectional diagram to illustrate a process in the manufacturing method of the flash memory according to the present embodiment. In FIG. 18, a cross section along the Y direction (cross section of the ZY plane) is shown.

As shown in FIG. 18, the protective layer covering the side surface of the stacked body 200 is removed from the slit SLT. Thus, the insulating layers 28 and 29 are exposed through the slits on the side surface of the stacked body 200.

For example, when the material of the conductive layers 21A and 21B is the same as the material of the protective layer, the conductive layer 21B is also etched by the same amount as the film thickness of the protective layer.

Figure 19:
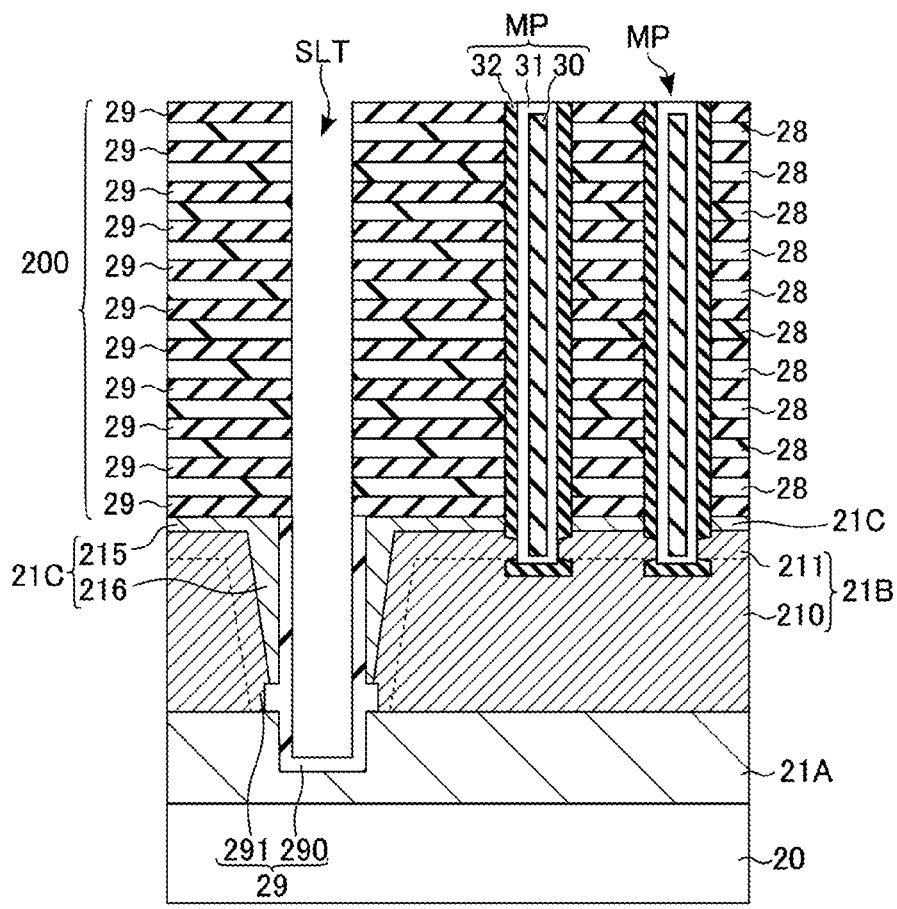
FIG. 19 is a cross-sectional diagram to show a process of the manufacturing method of the memory device according to the embodiment.

FIG. 19 is a cross-sectional diagram to illustrate a process in the manufacturing method of the flash memory according to the present embodiment. In FIG. 19, a cross section along the Y direction (cross section of the ZY plane) is shown.

As shown in FIG. 19, oxidation processing is performed on the conductive layers 21A, 21B, and 21C.

The exposed surfaces of the semiconductor layers (polysilicon layers) of the conductive layers 21A, 21B, and 21C are selectively oxidized. Thereby, the insulating layer is formed along the shape of the groove 99 of the conductive layers 21A, 21B, and 21C. For example, the portion 290 is formed on the upper surface and side surfaces of the conductive layer 21A and on the side surfaces of the conductive layers 21B and 21C.

When non-doped polysilicon is used for the conductive layer 21B and phosphorus-doped polysilicon is used for the conductive layer 21B, the oxidizing agent for the oxidation processing is more easily diffused into the silicon layer 21B containing phosphorus as compared with the non-doped silicon layer 21A.

Therefore, the portion 291 protruding in the Y direction is formed in the conductive layer 21B in the vicinity of the boundary between the conductive layer 21A and the conductive layer 21B.

Oxidation by the oxidation processing hardly occurs in the insulating layers 28 and 29 of the stacked body 200 exposed through the slit SLT.

Thereafter, replacement processing for the insulating layer 28 in the stacked body 200 is performed through the slit.

In the replacement processing, after the insulating layer 28 is removed from the stacked body 200, a conductive layer is formed in the space from which the insulating layer is removed (the space between the insulating layers 28 adjacent in the Z direction).

As a result, the conductive layer (word line) 23 is formed in the stacked body 200 as shown in FIG. 4.

After the formation of the conductive layer 23, the insulator 60 is embedded in the slit SLT. Further, after the formation of the slit SHE, the insulator 61 is formed in the slit SHE.

Thereafter, contact plugs and bit lines BL are subsequently formed by a known technique. In the hook-up region, contact plugs and wiring are formed.

The NAND flash memory of the present embodiment is completed through the above processes.

(C) SUMMARY

The NAND flash memory of the present embodiment has a structure in which the source line is electrically coupled to the semiconductor layer (conductive layer) in the memory pillar through the opening on the side surface of the memory pillar.

In the present embodiment, the source line (or source line contact) includes the three layers 21A, 21B, and 21C. The conductive layer 21B is provided between the two conductive layers 21A and 21B in the Z direction. The conductive layer 21C functions as a stopper layer when forming the slit. The dimension of the conductive layer 21C (portion 216) in the slit region in the Z direction is larger than the dimension of the conductive layer 21C (portion 215) in the cell region in the Z direction.

In a flash memory having a certain structure, the dimension of the stopper layer in the Z direction for forming the slit is constant between the cell region and the slit region. When the dimension of the stopper layer in the Z direction is thin, an unintended layer may be exposed to the slit due to variations of etching in the Z direction in the slit forming process. In the process of removing a layer through the slit, an unintentionally exposed layer may be exposed to the etching conditions of the layer and removed. As a result, defects can occur in the flash memory.

In the present embodiment, the relatively thick stopper layer can reduce processing defects due to variations in the etching depth direction in the slit formation region.

As described above, the flash memory according to the present embodiment can improve the process robustness against the variations in the etching depth direction when a slit is formed. Accordingly, the flash memory according to the present embodiment can improve the manufacturing yield of the flash memory.

In the present embodiment, the distance between the conductive layer 21B and the conductive layer 22 can be reduced in the cell region while providing a thick stopper layer in the slit region. For example, a conductive layer (for example, an impurity semiconductor layer) used for the source line is used as a dopant diffusion source to the semiconductor layer of the memory pillar.

In the present embodiment, since the dimension of the stopper layer 21C in the cell region in the Z direction is small, the distance between the conductive layer 22 serving as the select gate line on the source side and the conductive layer 21B serving as the dopant diffusion source is reduced. Therefore, the dopant (for example, phosphorus) in the conductive layer 21B easily reaches the portion of the memory pillar facing the conductive layer 22 by the diffusion of the dopant. As a result, the flash memory of the present embodiment can improve the characteristics of the select transistor on the source side.

In a flash memory having a certain structure, any of a plurality of layers constituting a select gate line on the source side of a cell string may be used as a stopper layer at the time of forming a slit. In this case, depending on the material of the stopper layer, the resistance value of the select gate line on the source side may be high.

In the flash memory of the present embodiment, the select gate line on the source side of the NAND string may be configured without using a stopper layer for forming a slit.

As a result, the flash memory of the present embodiment can reduce the resistance value of the select gate line on the source side of the cell string.

As a result, the flash memory of the present embodiment can reduce the wiring delay (for example, RC delay) of the select gate line on the source side of the NAND string.

As described above, the memory device of the present embodiment can improve the characteristics.

(D) OTHERS

In this specification, "coupled" does not exclude a case where another component is interposed between two coupled components. In this specification, the term "contact" does not exclude the presence of other components between two components in contact.

While certain embodiments have been described, these embodiments have been presented by way of example only, and are not intended to limit the scope of the inventions. These novel embodiments can be implemented in various other forms, and various omissions, replacements, and changes can be made without departing from the spirit of the invention. These embodiments and modification examples thereof are included in the scope and gist of the invention and are included in the invention described in the claims and the equivalent scope thereof.

What is claimed is:

1. A memory device comprising:
   a substrate;
   a first semiconductor layer provided above the substrate and including a first region having a first impurity concentration, a second region having a second impurity concentration above the first region, and a third region having a third impurity concentration above the second region, the second impurity concentration being higher than the first impurity concentration and the third impurity concentration;
   a stacked body provided above the first semiconductor layer and including a plurality of first conductive layers stacked in a first direction;
   a memory pillar extending in the first direction through the stacked body and the first semiconductor layer and having a side wall portion that is in contact with the second region of the first semiconductor layer;
   a plurality of memory cells provided at intersections of the memory pillar and the plurality of first conductor layers;
   an insulator extending in the first direction through the stacked body and the first semiconductor layer and in a second direction, and dividing the stacked body and the first semiconductor layer in a third direction, the second direction crossing the first direction, the third direction crossing the first direction and the second direction; and
   a first insulating layer provided between a side surface of the insulator and the first, second and third regions, the first insulating layer including a portion protruding into the second region in the third direction, wherein
   the third region includes a first portion that is in contact with the insulator and a second portion that is in contact with the memory pillar, and
   a thickness of the first portion in the first direction is greater than a thickness of the second portion in the first direction.

2. The memory device according to claim 1, wherein each of the first conductive layers serves as a word line of one of the plurality of memory cells.

3. The memory device according to claim 1, wherein each of the first, second, and third regions of the first semiconductor layer is formed of poly-silicon.

4. The memory device according to claim 1, wherein the insulator is formed of silicon oxide.

5. The memory device according to claim 1, wherein a distance from the substrate to the memory pillar is longer than a distance from the substrate to the insulator.

6. The memory device according to claim 1, wherein the memory pillar does not extend into the first region, and the insulator extends into the first region.

7. The memory device according to claim 1, wherein the first insulating layer is in direct contact with the side surface of the insulator.

8. The memory device according to claim 1, wherein the first insulating layer is also provided between a bottom surface of the insulator and the first region.

9. The memory device according to claim 8, wherein the first insulating layer is in direct contact with the bottom surface of the insulator.

10. The memory device according to claim 1, wherein the first insulating layer is formed of silicon oxide.

11. The memory device according to claim 1, wherein the portion of the first insulating layer is in direct contact with the second region.

12. The memory device according to claim 1, wherein the portion of the first insulating layer is in direct contact with the first region.

13. The memory device according to claim 1, wherein
   the second region includes a first sub-region directly provided on the first region and a second sub-region directly provided above the first sub-region, and
   the second sub-region is in contact with the side surface of the first semiconductor layer.

14. The memory device according to claim 13, wherein the first sub-region is also in contact with the side surface of the first semiconductor layer.

15. The memory device according to claim 1, wherein the first region is in direct contact with the substrate.

16. A memory device comprising:
a substrate;
a first semiconductor layer provided above the substrate and including a first region having a first impurity concentration, a second region having a second impurity concentration above the first region, and a third region having a third impurity concentration above the second region, the second impurity concentration being higher than the first impurity concentration and the third impurity concentration;
a stacked body provided above the first semiconductor layer and including a plurality of first conductive layers stacked in a first direction;
a memory pillar extending in the first direction through the stacked body and the first semiconductor layer and having a side wall portion that is in contact with the second region of the first semiconductor layer;
a plurality of memory cells provided at intersections of the memory pillar and the plurality of first conductor layers; and
an insulator extending in the first direction through the stacked body and the first semiconductor layer and in a second direction, and dividing the stacked body and the first semiconductor layer in a third direction, the second direction crossing the first direction, the third direction crossing the first direction and the second direction, wherein
the third region includes a first portion that is in contact with the insulator and a second portion that is in contact with the memory pillar,
a thickness of the first portion in the first direction is greater than a thickness of the second portion in the first direction,
the second region includes a first sub-region directly provided on the first region and a second sub-region directly provided above the first sub-region, and
the second sub-region is in contact with the side surface of the first semiconductor layer.

17. The memory device according to claim 16, wherein the first sub-region is also in contact with the side surface of the first semiconductor layer.

\* \* \* \* \*